(12) United States Patent
Chen et al.

(10) Patent No.: US 11,398,471 B2
(45) Date of Patent: Jul. 26, 2022

(54) DISPLAY MOTHERBOARD, METHOD OF FABRICATING THE SAME

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Xincheng Chen, Beijing (CN); Youxiong Wu, Beijing (CN); Xinquan Xie, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 130 days.

(21) Appl. No.: 16/755,781

(22) PCT Filed: Nov. 20, 2019

(86) PCT No.: PCT/CN2019/119713
§ 371 (c)(1),
(2) Date: Apr. 13, 2020

(87) PCT Pub. No.: WO2020/140640
PCT Pub. Date: Jul. 9, 2020

(65) Prior Publication Data
US 2021/0225835 A1 Jul. 22, 2021

(30) Foreign Application Priority Data
Jan. 2, 2019 (CN) .......................... 201910001978.2

(51) Int. Cl.
*H01L 23/60* (2006.01)
*H01L 27/02* (2006.01)
(Continued)

(52) U.S. Cl.
CPC ...... *H01L 27/0296* (2013.01); *H01L 27/0266* (2013.01); *H01L 27/0292* (2013.01);
(Continued)

(58) Field of Classification Search
CPC ..... H01L 25/048; H01L 25/167; H01L 27/15; H01L 27/288; H01L 27/32;
(Continued)

(56) References Cited

U.S. PATENT DOCUMENTS

2007/0296881 A1 12/2007 Choi et al.
2011/0193837 A1* 8/2011 Sato .................. G02F 1/167
345/205
(Continued)

FOREIGN PATENT DOCUMENTS

CN 101089685 A 12/2007
CN 105355633 A 2/2016
(Continued)

OTHER PUBLICATIONS

Office Action dated May 15, 2020, issued in counterpart CN Application No. 201910001978.2, with English translation (14 pages).
(Continued)

*Primary Examiner* — Samuel Park
(74) *Attorney, Agent, or Firm* — WHDA, LLP

(57) ABSTRACT

The present disclosure generally relates to display technologies, and in particular, to a display motherboard, and a method of fabricating the display motherboard. A display motherboard includes a plurality of display substrate units on a base substrate, a gap between adjacent display substrate units, and at least one electrostatic equilibrator in the gap. Each display substrate unit includes at least one trace comprising a display portion that extends into the display substrate unit and a gap portion that extends into a gap
(Continued)

adjacent to the display substrate unit. Each electrostatic equilibrator is configured to electrically couple gap portions of traces of the adjacent display substrate units, so as to form a conductive path between the gap portions.

12 Claims, 19 Drawing Sheets

(51) Int. Cl.
  *H01L 27/12* (2006.01)
  *G02F 1/1333* (2006.01)
  *G02F 1/1362* (2006.01)
  *H01L 21/78* (2006.01)

(52) U.S. Cl.
  CPC ........ *H01L 27/124* (2013.01); *H01L 27/1288* (2013.01); *G02F 1/133351* (2013.01); *G02F 1/136204* (2013.01); *H01L 21/78* (2013.01)

(58) Field of Classification Search
  CPC ..... H01L 51/0032; H01L 51/05; H01L 51/00; H01L 27/307; H01L 27/286; H01L 51/4253; H01L 51/442; H01L 27/14647; H01L 27/14687; H01L 27/14632; H01L 27/146; H01L 31/02; H01L 31/10; H01L 27/30; H01L 23/60; H01L 27/0296; H01L 27/0266; H01L 27/0292; H01L 27/124; H01L 27/1288; H01L 21/78; H01L 27/0248; Y02E 10/549; H04N 5/369; G02F 1/133351; G02F 1/136204
  See application file for complete search history.

(56) References Cited

U.S. PATENT DOCUMENTS

| | | | |
|---|---|---|---|
| 2014/0340603 A1* | 11/2014 | Hu | G02F 1/136227 349/43 |
| 2015/0115271 A1* | 4/2015 | Yoon | H01L 27/0255 257/72 |
| 2015/0241744 A1 | 8/2015 | Nakata et al. | |
| 2017/0269411 A1 | 9/2017 | Liu et al. | |
| 2018/0130790 A1* | 5/2018 | Park | H01L 27/0266 |

FOREIGN PATENT DOCUMENTS

| | | | |
|---|---|---|---|
| CN | 108461492 A | | 8/2018 |
| CN | 109727972 A | | 5/2019 |
| CN | 110164876 A | * | 8/2019 |

OTHER PUBLICATIONS

International Search Report dated Feb. 21, 2020, issued in Application No. PCT/CN2019/119713 (10 pages).

* cited by examiner

DISPLAY MOTHERBOARD, METHOD OF FABRICATING THE SAME

CROSS-REFERENCE TO RELATED APPLICATIONS

This application claims benefit of the filing date of Chinese Patent Application No. 201910001978.2 filed on Jan. 2, 2019, the disclosure of which is hereby incorporated in its entirety by reference.

TECHNICAL FIELD

The present disclosure generally relates to display technologies, and in particular, to a display motherboard, and a method of fabricating the display motherboard.

BACKGROUND

A display panel is commonly manufactured using a carrier carrying a base substrate, forming the display substrates on the base substrate, and finally separating the base substrate from the carrier, so as to obtain the display panel.

BRIEF SUMMARY

The present disclosure provides a display motherboard. The display motherboard may comprise a plurality of display substrate units on a base substrate, a gap between adjacent display substrate units, and at least one electrostatic equilibrator in the gap.

In at least some embodiments, each display substrate unit may comprise at least one trace comprising a display portion that extends into the display substrate unit and a gap portion that extends into a gap adjacent to the display substrate unit.

In at least some embodiments, each electrostatic equilibrator may be configured to electrically couple gap portions of traces of the adjacent display substrate units, so as to form a conductive path between the gap portions.

In at least some embodiments, the electrostatic equilibrator may be either a conductive link comprising a first transistor coupled to a second transistor, or a conductor block.

In at least some embodiments, the electrostatic equilibrator may be a conductive link. In such embodiments, the first transistor may comprise a first control electrode on the base substrate, a first active layer on the first control electrode, a first sub-electrode on the base substrate and overlapping with a first end portion of the first active layer, and a second sub-electrode on the base substrate and overlapping with a second end portion of the first active layer opposite from the first end portion. The second transistor may comprise a second control electrode on the base substrate and positioned to be directly opposite from the first control electrode, a second active layer on the second control electrode, a third sub-electrode on the base substrate and overlapping with a first end portion of the second active layer, and a fourth sub-electrode on the base substrate and overlapping with a second end portion of the second active layer opposite from the first end portion of the second active layer.

In at least some embodiments where the electrostatic equilibrator is a conductive link, the first control electrode, the first sub-electrode, and the third sub-electrode may be electrically coupled to each other.

In at least some embodiments where the electrostatic equilibrator is a conductive link, the second control electrode, the second sub-electrode, and the fourth sub-electrode may be electrically coupled to each other.

In at least some embodiments where the electrostatic equilibrator is a conductive link, the first control electrode and the second control electrode may be formed in a first layer on the base substrate. In at least some embodiments, the first active layer and the second active layer may be formed in a second layer on the base substrate. In at least some embodiments, the first sub-electrode, the second sub-electrode, the third sub-electrode, and the fourth sub-electrode may be formed in a third layer on the base substrate.

In at least some embodiments where the electrostatic equilibrator is a conductive link, a gap portion of a first trace of a first display substrate unit on one side of the gap may be coupled to the first control electrode or the first sub-electrode. In at least some embodiments, a gap portion of a second trace of a second display substrate unit on the opposite side of the gap from the first display substrate unit may be coupled to the second control electrode or the fourth sub-electrode. In at least some embodiments, the first trace and the second trace may be configured to transmit a same type of signal.

In at least some embodiments where the electrostatic equilibrator is a conductive link, the conductive link may be an intra-layer conductive link. In at least some embodiments, when the gap portion of the first trace is electrically coupled to the first control electrode, the gap portion of the second trace may be electrically coupled to the second control electrode. In at least some embodiments, when the gap portion of the first trace is electrically coupled to the first sub-electrode, the gap portion of the second trace may be electrically coupled to the fourth sub-electrode.

In at least some embodiments where the electrostatic equilibrator is a conductive link, the conductive link is an inter-layer conductive link. In at least some embodiments, when the gap portion of the first trace may be electrically coupled to the first control electrode, the gap portion of the second trace is electrically coupled to the fourth sub-electrode. In at least some embodiments, when the gap portion of the first trace is electrically coupled to the first sub-electrode, the gap portion of the second trace may be electrically coupled to the second control electrode.

In at least some embodiments where the electrostatic equilibrator is a conductive link, the display motherboard may further comprise a first insulation layer on a side of the first control electrode and the second electrode opposite from the base substrate, and a plurality of via holes that extend through the first insulation layer.

In at least some embodiments where the electrostatic equilibrator is a conductive link, the first control electrode may be coupled to the first sub-electrode and the third sub-electrode through a first set of via holes. In at least some embodiments, the second control electrode may be coupled to the second sub-electrode and the fourth sub-electrode through a second set of via holes.

In at least some embodiments where the electrostatic equilibrium is a conductive link, at least a portion of the plurality of via holes may be filled with a conductive material.

In at least some embodiments where the electrostatic equilibrium is a conductive link, the first sub-electrode, the first active layer, the second sub-electrode, the third sub-electrode, the second active layer, and the fourth sub-electrode may be on a side of the first insulation layer opposite from the first control electrode and the second control electrode.

In at least some embodiments where the electrostatic equilibrium is a conductive link, the plurality of via holes may not extend through the first control electrode or the second control electrode.

In at least some embodiments where the electrostatic equilibrium is a conductive link, the first active layer and the second active layer may each comprise an amorphous silicon layer on the base substrate and an n-doped amorphous silicon layer on the amorphous silicon layer. In at least some embodiments, orthographic projection of each of the first sub-electrode, the second sub-electrode, the third sub-electrode, and the fourth sub-electrode on the base substrate may overlap partially with orthographic projection of the n-doped amorphous silicon layer of each of the first active layer and the second active layer on the base substrate.

In at least some embodiments, the electrostatic equilibrator is a conductor block composed of a conductive material.

In at least some embodiments, the at least one trace may comprise a lead. In at least some embodiments, the display motherboard may further comprise at least one lead connector configured to couple the lead to the electrostatic equilibrator.

In at least some embodiments, the gap portion of the at least one trace may comprise an extension that extends in a direction away from the at least one electrostatic equilibrator. In at least some embodiments, the display motherboard may further comprise a test electrode coupled to the extension.

The present disclosure also provides a method of fabricating a display motherboard. The display motherboard may be as described above. The method may comprise forming the plurality of display substrate units, and forming the at least one trace and the at least one electrostatic equilibrator to which the at least one trace is coupled in a same patterning step using a single mask.

In at least some embodiments, the method may comprise forming the plurality of display substrate units, and at least one trace, and forming the conductive link.

In at least some embodiments, the forming of the conductive link may comprise performing a first patterning step using a single first mask to form the first control electrode and the second control electrode on the base substrate, performing a second patterning step using a single second mask to form the first active layer and the second active layer on the base substrate, and performing a third patterning step using a single third mask to form the first sub-electrode, the second sub-electrode, the third sub-electrode, and the fourth sub-electrode on the base substrate.

The present disclosure also provides a method of fabricating a display substrate. The method may comprise forming a display motherboard, and cutting the display motherboard to separate the plurality of display substrate units from each other. The display motherboard may be as described above.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the present disclosure are apparent from the following detailed description taken in conjunction with the accompanying drawings in which:

Figure 1:
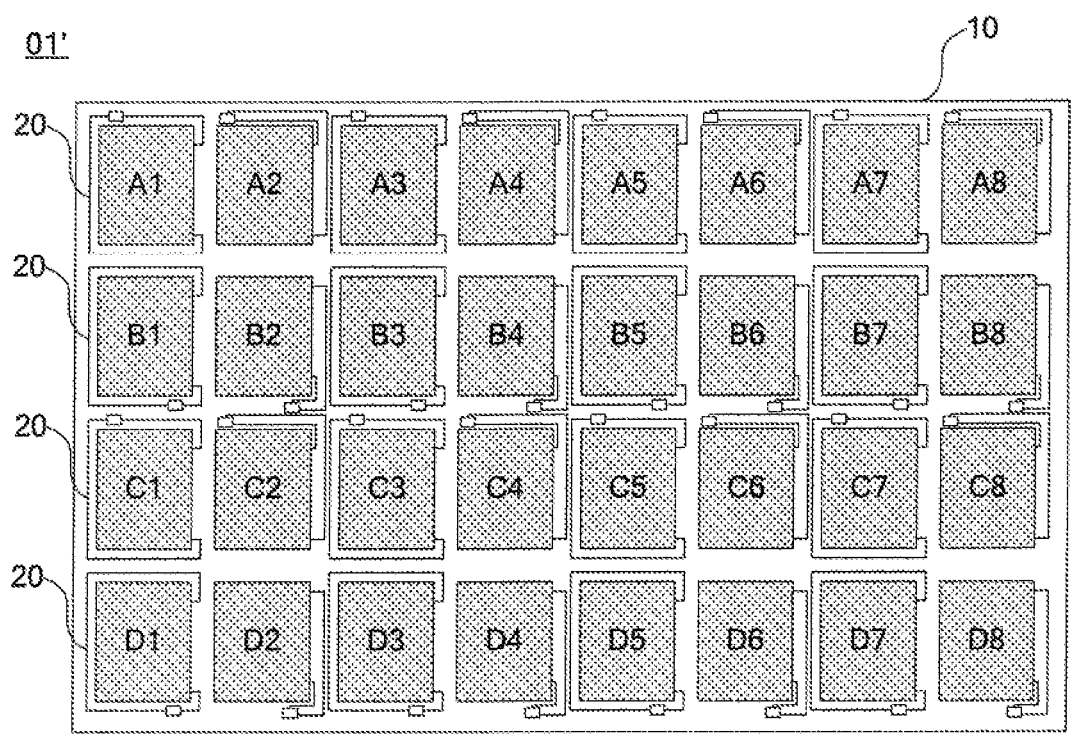
FIG. 1 shows a top view of a schematic diagram of a display motherboard.

The various features of the drawings are not to scale as the illustrations are for clarity in facilitating one skilled in the art in understanding the invention in conjunction with the detailed description.

DETAILED DESCRIPTION

Next, the embodiments of the present disclosure will be described clearly and concretely in conjunction with the accompanying drawings, which are described briefly above. The subject matter of the present disclosure is described with specificity to meet statutory requirements. However, the description itself is not intended to limit the scope of this disclosure. Rather, the inventors contemplate that the claimed subject matter might also be embodied in other ways, to include different steps or elements similar to the ones described in this document, in conjunction with other present or future technologies.

While the present technology has been described in connection with the embodiments of the various figures, it is to be understood that other similar embodiments may be used or modifications and additions may be made to the described embodiments for performing the same function of the present technology without deviating therefrom. Therefore, the present technology should not be limited to any single embodiment, but rather should be construed in breadth and scope in accordance with the appended claims. In addition, all other embodiments obtained by one of ordinary skill in the art based on embodiments described in this document are considered to be within the scope of this disclosure.

The array manufacturing process for display panels, for example, liquid crystal display panels, is very complex. To realize mass production, display devices are typically manufactured by forming a plurality of display substrate units on a base substrate that is carried by a carrier substrate, which may be a motherboard for the display devices. After the display substrate units are formed on the display motherboard, an array test (AT) is performed to detect defects in the construction of the display substrate units. The AT is performed using data lines, scan lines, clock signal lines, and so on. Following the AT inspection, the motherboard is cut to divide the motherboard into the respective display substrate units, and the base substrate is separated from the carrier, in order to obtain the individual display substrates.

During the manufacturing of the display motherboard, frequent rubbing between the base substrate and the carrier, as well as the frequent peeling of the base substrate, can cause the separation and accumulation of static charges between adjacent display substrate units. The static charge build-up disrupts the electrostatic balance between adjacent display substrate units, and can lead to electrostatic discharge (ESD) defects.

For instance, along with the growing demand for higher resolution on a display panel, more and more signal lines are being provided on the substrate forming the display panel. To maximize the utilization of real estate on the carrier substrate (for example, a glass carrier substrate), the separation between adjacent units becomes increasingly narrow, as does the separation between traces and other conductive structures in the periphery of the display substrate units. When electrostatic charges build up in adjacent units, a large potential difference can form between the adjacent units. As a result, electrostatic discharges are liable to occur between traces of the adjacent units, and in particular, between traces that are the closest to each other. An electrostatic discharge causes an instantaneous hike in current, which can leak into the electrical components that are electrically connected to the traces and other conductive structures. For example, the current may flow to the electrical components in the gate driver on array ("GOA") area, the active area ("AA"), and the like, destroying those components and affecting the production yield.

The present disclosure provides a display motherboard that is capable of preventing ESDs between adjacent display substrate units, thus reducing damages caused by ESDs and increasing the production yield. The present disclosure also provides a method of fabricating the display motherboard, a display panel fabricated using the display motherboard, and a display device comprising the display panel.

During the manufacturing of the display motherboard, rubbing between the carrier substrate and the assembly stage, and the peeling of the base substrate from the carrier (for instance, an assembly stage), occur frequently. For example, when placing the base substrate on the assembly stage, or when the lift pin on the carrier is used to raise the substrate, rubbing and peeling may occur, which can cause static charges between adjacent display substrate units to build up and lead to ESDs.

In addition, the manufacturing of display motherboards involves multiple patterning processes, during which a substrate is patterned using a mask. The patterning process evolves with advancements in mask designs and techniques, and the available designs and configurations of display motherboards are constantly changing. On one display motherboard may be found a range of patterns corresponding to the different models of display panels being formed in different regions of the motherboard. Different models of display panels contain different components, so that the different regions of the motherboard corresponding to the different models of display panels are also formed with different components. These structural differences can result in variations in the charge density of static charges accumulated on the trace structures surrounding the peripheries of adjacent regions on the display motherboard, and/or of the static charges separated out of those trace structures. When these variations result in large potential differences between adjacent regions, electrostatic discharges can easily occur between traces surrounding the peripheries of those adjacent regions, leading to electrostatic discharge defects.

FIG. 1 shows a top view of a schematic diagram of a display motherboard according to an embodiment of the present disclosure. In the non-limiting embodiment shown in FIG. 1, the display motherboard 01' contains four (4) models of display panels (A, B, C, D). The units A1 to A8, B1 to B8, C1 to C8, and D1 to D8 represent eight (8) display substrate units of one of the four models, respectively. The display substrate units for each model are arranged so as to be spaced apart from each other, and constitute the active areas AA of the display panels.

The configurations in and of the active areas of each display panel are not shown in FIG. 1. Those configurations are not particularly limited. The active areas may be configured in any appropriate manner known to a person of ordinary skill in the art depending on need. Further, it is understood that the different models of display panels represented in FIG. 1 may have different dimensions and/or different structures.

Further as shown in FIG. 1, to maximize the utilization of the base substrate 10 of the display motherboard 01' and reduce the manufacturing costs, the distance separating the traces 20 surrounding the peripheries of adjacent active areas AA is minimized.

Once the display motherboard is made, the display motherboard is unloaded from the assembly stage, and the final array tester performs a final array test (AT) on the display motherboard.

Figure 2:
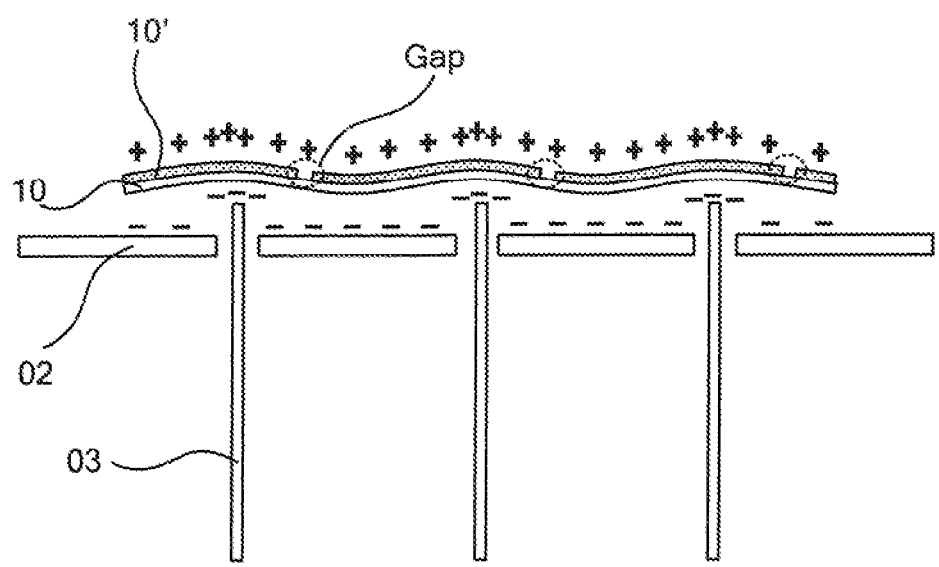
FIG. 2 shows a schematic diagram illustrating the shifts in static charges when a display motherboard is unloaded from the assembly stage prior to the array test.

FIG. 2 shows a schematic diagram illustrating the shifts in static charges when a display motherboard according to an embodiment of the present disclosure is unloaded from the assembly stage prior to the array test.

As shown in FIG. 2, the lift pins 03 on the assembly stage 02 raise and separate the display motherboard 01' from the assembly stage 02. This operation disrupts the static charges between adjacent display panels on the base substrate 10, causing separation of the static charges. In FIG. 2, the "+" sign denotes a positive charge, and the "−" sign denotes a negative charge. Different regions 10' on the base substrate 10, corresponding to different display panels, have different configurations, for example, in terms of dimensions, positions, and/or internal circuit designs. As such, the accumulated charge density, and therefore the potential, also differs between different regions 10'.

Each component in a region 10' on the base substrate 10 is an independent structure, so that gaps may be formed in each region 10', for example, as shown in FIG. 2. Charges that accumulate in the gaps may not dissipate and be neutralized. As a result, the accumulated charges may cause electrostatic discharges at the closest trace structure associated with the adjacent display substrate unit, which can in turn cause ESD defects.

Figure 3:
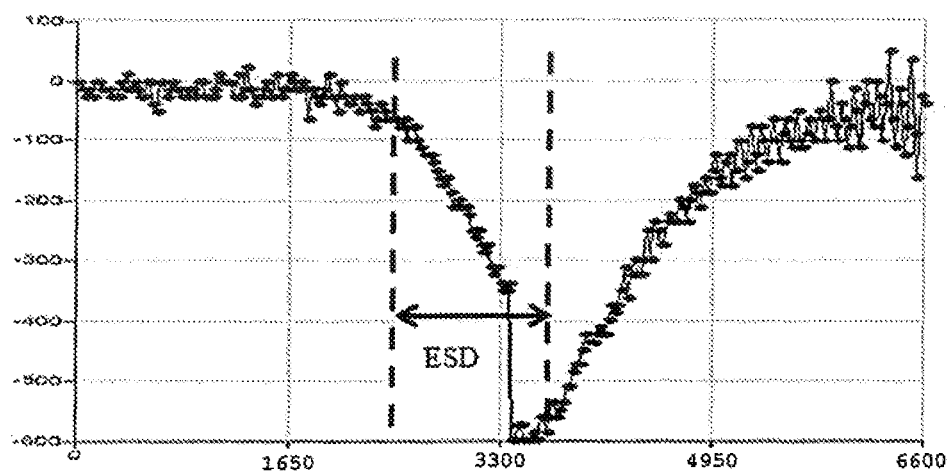
FIG. 3 shows a graphical diagram illustrating the electrostatic discharge (ESD) effects when a display motherboard is peeled from the assembly stage.

The lift pins 03 in the assembly stage 02 separate the display motherboard 01' from the stage 02. At the instant of separation, the electrostatic charges in different regions 10' of the display motherboard 01' become imbalanced, as shown in FIG. 2, causing an ESD, as shown in FIG. 3.

Further, in embodiments such as that shown in FIG. 1, the traces 20 surrounding the active areas (AA) of adjacent display substrate units (for example, A1, B1, C1, and D1) are in close proximity with each other. This close proximity can increase the risk of an electrostatic discharge between adjacent active areas.

Figure 4:
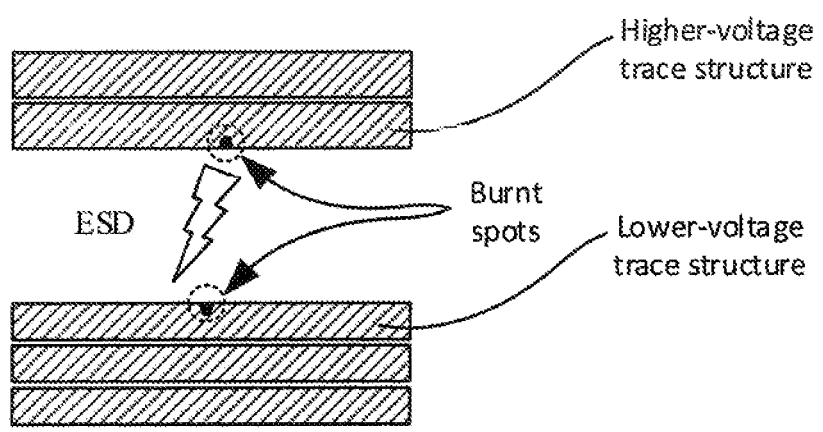
FIG. 4 shows a schematic diagram illustrating an electrostatic discharge (ESD) in the trace structures on a display motherboard.
Figure 5:
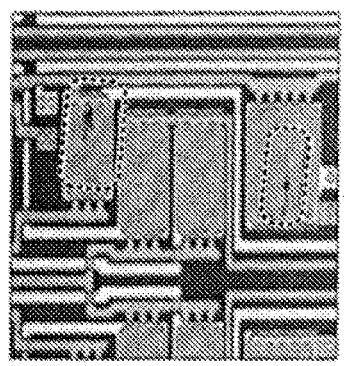
FIG. 5 is a schematic diagram illustrating a high current breaking through a gate driver on array ("GOA") area on a display motherboard, as a result of an electrostatic discharge (ESD) in the trace structures on the display motherboard.

FIG. 4 shows a schematic diagram illustrating an electrostatic discharge (ESD) from the trace structures on a display motherboard. As shown in FIG. 4, when a voltage difference develops between the trace structures of adjacent display substrate units on the display motherboard, an electrostatic discharge can occur. In turn, the high voltage instantaneously released by the electrostatic discharge breaks through and damages structures that are electrically connected, causing electrostatic discharge defects. FIG. 5 is a schematic diagram illustrating a high current breaking through a gate driver on array ("GOA") area on a display motherboard, as a result of an electrostatic discharge in the trace structures on the display motherboard. In FIG. 5, (for example, the electronic component in the GOA).

To more concretely illustrate the ESD defects that may occur in a display motherboard, the following descriptions refer to a conventional display motherboard and the conventional array tests (AT) that are performed on the display motherboard.

Figure 6:
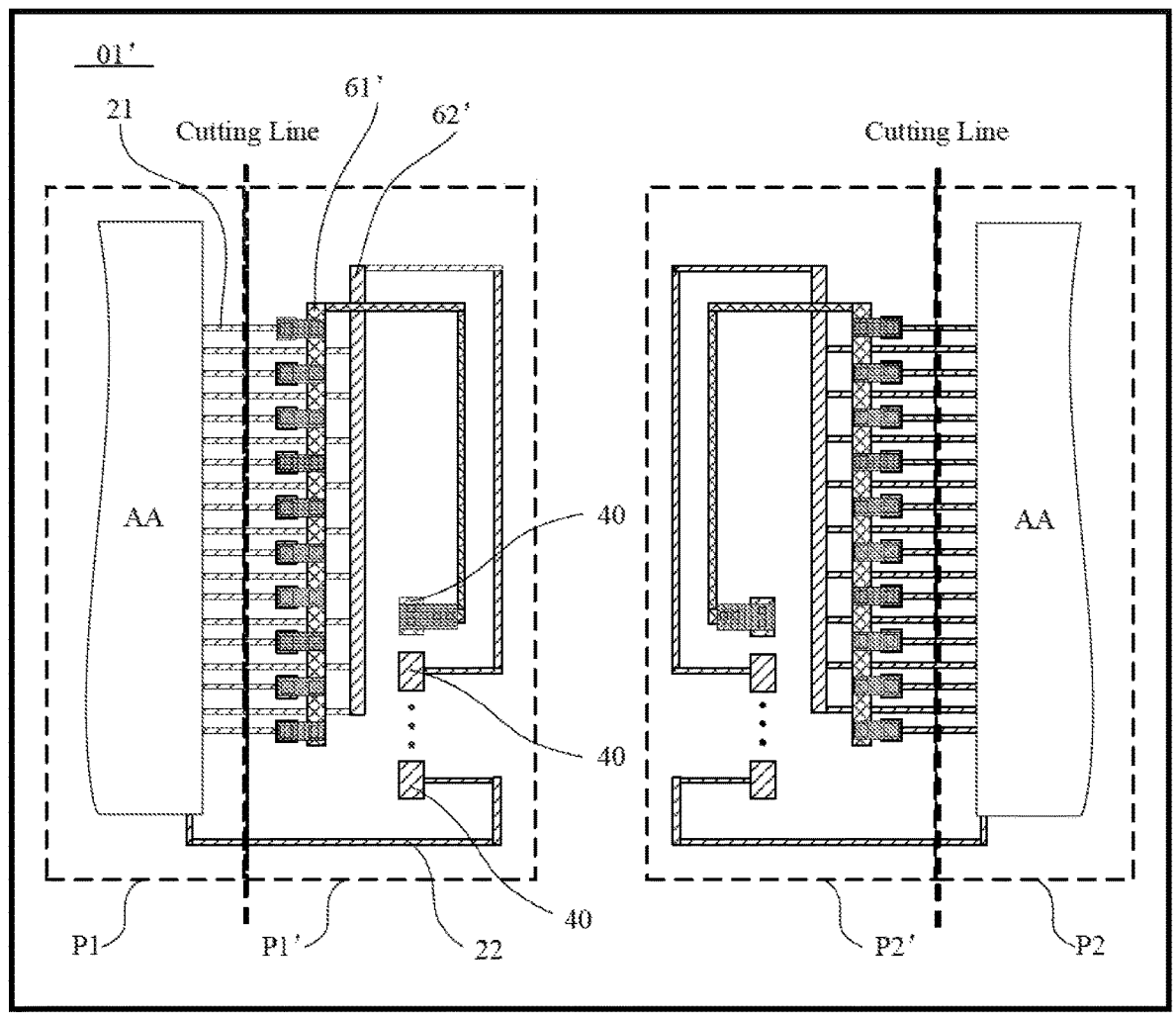
FIG. 6 shows a schematic diagram of a top view of a portion of a conventional display motherboard.

FIG. 6 shows a schematic diagram of a top view of a portion of a display motherboard. More particularly, FIG. 6 shows a top view of a portion of a completed display motherboard before it is cut to obtain the individual display substrates. "P1" and "P2" represent the individual display substrate units on the display motherboard. "AA" represents the active area of each display substrate unit P1, P2. Each display substrate unit P1, P2 contains numerous traces for transmitting different signals, including the leads 21 for the data lines and STV (Start Vertical) lines for transmitting gate start signals. These traces are electrically connected to components in the active area AA. For example, the leads 21 are connected to the data lines, and the STV lines are connected to the scan lines and extend to the peripheral regions P1', P2' of the display substrate units P1, P2.

An array test (AT) is an inspection that is generally performed after a display motherboard is manufactured. The array test detects defects by supplying the corresponding signals to each signal lines. For example, during an array test, data signals, gate signals (i.e., scan signals), clock signals, ADD signals (i.e., auxiliary data signals), STV signals (i.e., gate start signals), VDD signals (i.e., digital power signals), and VSS signals (i.e., digital ground signals) may be supplied to the data lines, scan lines, clock signal lines, display driver signal lines, and the like.

The signal lines extend to the peripheral regions P1', P2' of the display substrate units P1, P2, that is, an area surrounding each display substrate unit P1, P2. Array test (AT) pads are usually provided at the termini of ST lines and other display drive signal lines, and are configured to allow array test instruments to transmit the appropriate signals. Odd-numbered leads 21 are electrically connected to each other to form the data odd-numbered shorting bar 61' ("DO shorting bar"), and the even-numbered leads 21 are electrically connected to each other to form the data even-numbered shorting bar 62'("DE shorting bar"). AT pads 40 are also provided at the termini of the shorting bars 61', 62', so that the array test instruments may transmit the appropriate data signals to the leads 21.

To avoid interferences with the operations of the final display device, portions of the leads that extend to the peripheral regions P1', P2' of the display substrate units P1, P2 on the display motherboard, as well as the shorting bars, are removed during cutting. In FIG. 6, the cutting lines mark the positions where the display motherboard would be cut to obtain the display substrates P1, P2.

Even before the array test is performed, a large static charge build-up has already developed on the base substrate 10 of the display motherboard 01' as a result of the manufacturing process. Further, the trace structures, including the shorting bars, of adjacent display substrate units are in close proximity to each other, and therefore, to avoid interferences between array test signals being supplied to different display substrate units on the display motherboard 01', the trace structures of adjacent display substrate units are electrically insulated from each other. As a result, when electrostatic charge build-ups produce a large potential difference between adjacent display substrate units, electrostatic discharges occur in the trace structures, such as the shorting ban, of those display substrate units, causing ESD defects.

Conventional techniques for preventing or protecting against electrostatic discharges involve "blocking" or "dissipation". "Blocking" involves slowing down the process of loading the base substrate onto the assembly stage, or unloading the finished display motherboard from the assembly stage. This minimizes static charge build-up caused by contact and/or separation of the base substrate or the display motherboard and the assembly stage. "Blocking" therefore attempts to eliminate the root causes leading to the build-up of static charges. "Dissipation" involves quickly neutralizing electrostatic charges using an ionizer or a metal connection, so that the build-up of static charges does not reach the threshold for an electrostatic discharge. An objective of "dissipation" is to protect the electronic components on the display motherboard.

Of the two principles for preventing electrostatic discharges, "dissipation" is more commonly employed. One specific implementation of "dissipation" includes installing grounded lines during the manufacturing process. All or almost all conductive and dissipative materials would be grounded. For instance, in each display substrate unit, the gate metal layer and the source/drain metal layer each includes at least one ground line. Or in the active area of each display substrate unit, the gate metal layer and the source/drain metal layer are connected.

Conventional techniques have limitations, however. Those techniques prevent the build-up of static charges during fabrication of the display motherboard, but before a conductive link capable of dissipating static charges is formed. The techniques thus do not address electrostatic discharge defects that may occur during array testing after the display motherboard has been manufactured. Further, during fabrication, ground lines are not actually used, as the ground lines are neither directly nor indirectly grounded, so that static charges that accumulate over the course of fabrication are not actually dissipated.

After an array substrate motherboard and a color filter substrate motherboard are assembled to form a liquid crystal display motherboard, the display motherboard is cut to obtain the individual display substrates (for example, by cutting according to the array substrates). As such, conventional technologies for preventing electrostatic discharges are designed for an individual display substrate. Regardless of how the gate metal layer or source/drain metal layer is grounded, conventional technologies focused on individual display substrate units would be incapable of neutralizing the potential difference between the trace structures of adjacent display substrate units, and would not prevent electrostatic discharges that may occur at the trace structures. In other words, conventional technologies for preventing electrostatic discharges are inapplicable to a display motherboard as a whole.

The present disclosure thus provides a display motherboard that addresses at least the above problems.

Figure 7:
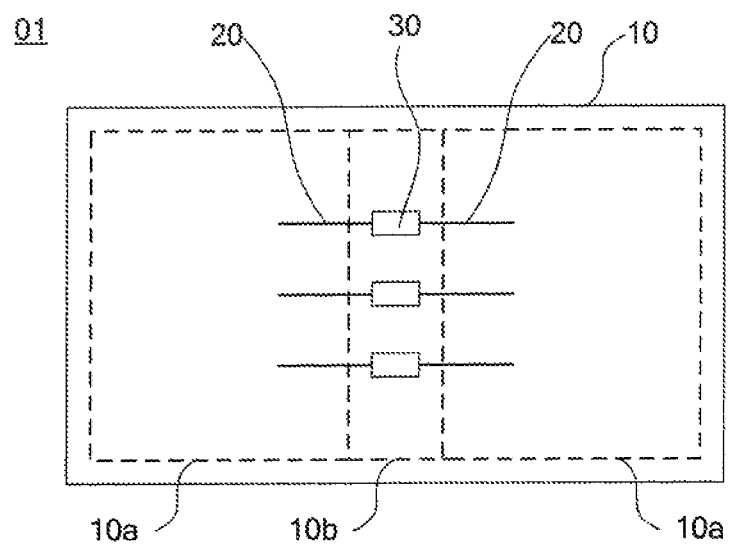
FIG. 7 shows a schematic diagram of a top view of display motherboard according an embodiment of the present disclosure.

FIG. 7 shows a schematic diagram of a top view of display motherboard according an embodiment of the present disclosure.

As shown in FIG. 7, the display motherboard 01 comprises a base substrate 10. The base substrate 10 comprises a plurality of display substrate units 10a forming a plurality of display substrates 10'. A gap 10b is formed between adjacent display substrate units 10a.

The display motherboard 01 further comprises a plurality of traces 20 on the base substrate 10 and at least one electrostatic equilibrator 30 in the gap 10b. Each trace 20 comprises a display portion that is located in the corresponding display substrate unit 10a, and a gap portion that extends into the gap 10b. The display portion and the gap portion of the trace are continuous. The display portion of each trace extends into a corresponding display substrate unit 10a, and the gap portion extends into the gap 10b between adjacent display substrate units 10a. The present disclosure does not particularly limit the number, material, and other configurations of the traces 20, so long as the traces 20 form conductive structures that extend from the display substrate unit 10a into the gap 10b.

The at least one electrostatic equilibrator 30 is provided in the gap 10b. The electrostatic equilibrator 30 is configured to electrically couple the gap portions of traces 20 from the display substrate units 10a on either side of the gap 10b. More particularly, when static charge build-ups on the traces 20 in adjacent display substrate units 10a create a potential difference between those display substrate units 10a, the electrostatic equilibrator 30 is configured to electrically couple the traces 20 in those adjacent display substrate units 10a to each other, so as to transform the entire display motherboard 01 into a conductor. When there is no sufficient build-up of charges on the traces 20 to generate a potential difference between the adjacent display substrate units 10a, the electrostatic equilibrator 30 is effectively in a "standby" mode and does not affect the functions and operations of the display panel.

As shown in FIG. 7, each electrostatic equilibrator 30 is coupled to the gap portions of two traces 20, one from each of the two adjacent display substrate units 10a. However, it is understood that the present disclosure does not particularly limit the configurations of the coupling between the traces 20 and the at least one electrostatic equilibrator 30. The traces 20 may be coupled to the at least one electrostatic equilibrator 30 in any appropriate manner known to a person of ordinary skill in the art. For example, one electrostatic equilibrator 30 may be provided and coupled to the gap portions of all traces that transmit the same type of signals.

FIG. 7 shows only two display substrate units 10a on the display motherboard 01, but it is understood that the number of display substrate units 10a formed on the display motherboard 01 is not particularly limited. A display motherboard 01 may be versatilely configured to form any number of display substrate units 10a depending on need.

In some embodiments, the display motherboard 01 may be an array substrate motherboard. Each display substrate unit 10a may include at least one thin film transistor (TFT), at least one scan line, at least one signal line, at least one pixel electrode, and any other appropriate components and accessories known to a person of ordinary skill in the art. The structure of each display substrate unit 10a is therefore not particularly limited. The display motherboard 01 is ultimately cut to separate the display substrate units 10a, and their respective associated components, into a plurality of stand-alone display substrates (for example, array substrates if the display motherboard is an array substrate motherboard).

When cutting the display motherboard 01, the cutting line is between the display substrate unit 10a and the gap 10b. Cutting the display motherboard 01 to obtain the individual display substrate units 10a therefore also cuts the plurality of traces 20 to sever the display portions and the gap portions of the traces 20. The display portions of the traces remain on the corresponding display substrate unit 10a, and are no longer connected to the traces of other display substrate units 10a.

In the display motherboard of the present disclosure, the traces from adjacent display substrate units extend into the gap between the display substrate units, and are coupled to each other via the electrostatic equilibrator 30. When static charge build-ups on the traces 20 in adjacent display substrate units 10a create a potential difference between those display substrate units 10a, the electrostatic equilibrator 30 is configured to electrically couple the traces 20 in those adjacent display substrate units 10a to each other, so as to transform the entire display motherboard 01 into a conductor. By electrically coupling the traces 20 in the adjacent display substrate units 10a to each other, the electrostatic equilibrator 30 is also configured to neutralize the potential difference between the adjacent display substrate units 10a that is caused by the static charge build-ups on the traces 20, so as to achieve electrostatic equilibrium. The risk of an electrostatic discharge event is reduced. The risk of damages and defects caused by electrostatic discharges is also reduced, which can in turn increase the production yield.

Figure 8:
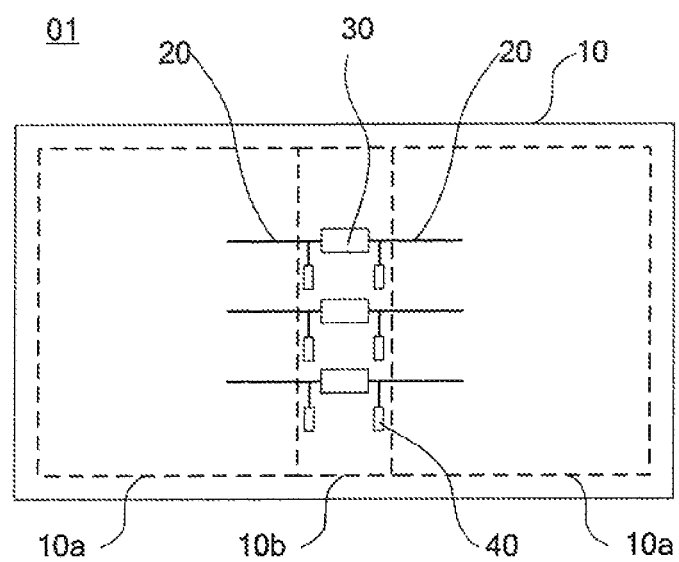
FIG. 8 shows a schematic diagram of a top view of display motherboard according another embodiment of the present disclosure.

FIG. 8 shows a schematic diagram of a top view of a display motherboard according another embodiment of the present disclosure.

As shown in FIG. 8, the display motherboard 01 may further comprise at least one test electrode 40 in the gap 10b. The test electrode 40 is coupled to the gap portion of at least one of the traces 20 that extend into the gap 10b. The test electrode 40 is configured to supply test signals to the corresponding trace(s) 20. The test signals supplied by the test electrode 40 are determined based on the type of signals that the corresponding trace 20 is configured to transmit. In at least some embodiments, the display motherboard 01 comprises as many test electrodes 40 as there are traces 20 with gap portions that extend into the gap 10b. More particularly, in some embodiments, the number of test electrodes 40 is the same as the number of gap portions in the gap 10b, for example, as shown in FIG. 8. In at least some embodiments, there is a one-to-one correspondence between a test electrode 40 and a trace 20, and specifically, one test electrode 40 is coupled to the gap portion of one trace 20. For example, as shown in FIG. 8, each test electrode 40 is coupled to the gap portion of one corresponding trace 20.

FIG. 8 shows a two-dimensional top view of a display motherboard according to the present disclosure, including the test electrodes 40. The shapes, dimensions, and geometry of the test electrodes 40 as shown in FIG. 8 are meant to be illustrative only and non-limiting. The present disclosure does not particularly limit the designs and constructions of the test electrodes, which may be any appropriate design and/or construction known to a person of ordinary skill in the art.

In some embodiments, a test electrode 40 occupies a larger surface area of the display motherboard 01 as compared to a trace 20. For example, in some embodiments, the width of a test electrode 40 is wider than the width of a trace 20. In some embodiments, both the width and the length of a test electrode 40 are larger than the width of a trace 20. The dimensions of a test electrode 40 relative to the trace 20 are configured to facilitate the coupling between the test electrode 40 and the probe of the testing instrument (for example, the array test instrument), which in turn facilitates the supply of test signals to the trace 20 through the test electrode 40.

In some embodiments, the gap portion of a trace 20 may comprise an extension that extends in a direction away from the electrostatic equilibrator 30 and perpendicular to the gap portion of the trace 20, for example, as shown in FIG. 8. The test electrode 40 is coupled to the extension of the gap portion. Providing the test electrode 40 on the extension of the gap portion of the trace 20 may prevent mutual interferences between the test electrode 40 and the electrostatic equilibrator 30.

It is understood that terms such as "electrically coupled" and "coupled" include, but are not limited to, embodiments in which the components (for example, conductors) are directly connected to each other and there is no potential difference between the components, as well as embodiments in which the components are indirectly connected via a conductive connection.

In the embodiments illustrated in FIGS. 7 and 8, the display motherboard may include a plurality of traces 20 that extend from the display substrate units 10a into the gaps 10b. However, the plurality of traces 20 may be configured to transmit different signals. Further, for every type of signal, the signal may be transmitted via one or more of the plurality of traces 20.

In some embodiments, each of the plurality of traces 20 may be configured to transmit one type of signal. In some embodiments, each of the plurality of traces 20 may be configured to transmit a different type of signal from the other of the plurality of traces 20. In some embodiments, a first subset of the plurality of traces 20 may be configured to transmit a first type of signal (that is, the signal is loaded on each of the two or more of the plurality of traces 20), a second subset of the plurality of traces 20 a second type of signal, and so on, and the first and second types of signal are different.

Each electrostatic equilibrator 30 is configured according to the type of signal being transmitted through the traces 20 coupled to the electrostatic equilibrator 30. That is, different electrostatic equilibrators 30 are used depending on the types of signals being transmitted through the traces 20 coupled to the electrostatic equilibrators 30.

The arrangement of the traces 20 and electrostatic equilibrators 30 described above is additionally advantageous for simplifying the wiring in the gap 10b.

The electrostatic equilibrator 30 may be a conductive link or a conductor block.

In some embodiments, the electrostatic equilibrator 30 is a conductive link. A conductive link is formed by coupling two transistors. The conductive link utilizes the transistors' operating principles of conductivity, and electrically couples the gap portions of traces extending from adjacent display substrate units when a potential difference exists between the display substrate units.

FIGS. 9A to 9D show schematic diagrams of a conductive link according to embodiments of the present disclosure. As shown in FIGS. 9A to 9D, the conductive link comprises a first transistor T1 coupled to a second transistor T2.

The first transistor T1 comprises a first control electrode T1$g$, a first active layer T1$a$, a first sub-electrode T1$s$, and a second sub-electrode T1$d$. The first sub-electrode T1$s$ and the second sub-electrode T1$d$ are arranged to face each other.

The second transistor T2 comprises a second control electrode T2$g$, a second active layer T2$a$, a third sub-electrode T2$s$, and a fourth sub-electrode T2$d$. The third sub-electrode T2$s$ and the fourth sub-electrode T2$d$ are arranged to face each other.

The first control electrode T1$g$, the first sub-electrode T1$s$, and the third sub-electrode T2$s$ are electrically coupled to each other. That is, the first control electrode T1$g$, the first sub-electrode T1$s$, and the third sub-electrode T2$s$ have the same potential. The second control electrode T2$g$, the second sub-electrode T2$d$, and the fourth sub-electrode T2$d$ are electrically coupled to each other. That is, the second control electrode T2$g$, the second sub-electrode T2$d$, and the fourth sub-electrode T2$d$ have the same potential.

The trace that extends from the display substrate unit on one side of the gap into a first portion of the gap (shown as "A" in FIGS. 9A to 9D) is electrically coupled to the first control electrode T1$g$ and/or the first sub-electrode T1$s$. The trace that extends from the display substrate unit on the other side of the gap into a second portion of the gap (shown as "B" in FIGS. 9A to 9D) is electrically coupled to the second control electrode T2$g$ and/or the fourth sub-electrode T2$d$.

In the first transistor T1, the first control electrode T1$g$ and the first active layer T1$a$ are electrically insulated from each other. The first control electrode T1$g$ may be a gate electrode. The first active layer T1$a$ may be a semiconductor layer composed of a semiconductor material. The semiconductor material may be any appropriate semiconductor material known to a person of ordinary skill in the art depending on need, including, but are not limited to, polycrystalline silicon, low-temperature polycrystalline silicon, amorphous silicon, oxide semiconductor material, organic semiconductor material, and the like.

The first sub-electrode T1$s$ and the second sub-electrode T1$d$ are electrically coupled to the first active layer T1$a$. The first sub-electrode T1$s$ may be a source electrode. The second sub-electrode T1$d$ may be a drain electrode.

The second transistor T2 and its associated components may be configured in the same manner as the first transistor T1.

In some embodiments, for example, as shown in FIGS. 9A to 9D, the transistors may each be a bottom-gate transistor, in which the gate electrode (i.e., the first control electrode T1$g$ and the second control electrode T2$g$ in the embodiments illustrated in FIGS. 9A to 9D) is on a side of the active layer that is closer to the base substrate. However, it is understood that the present disclosure does not limit the transistors to the bottom-gate transistor. In other words, in some embodiments, the transistors may each be a top-gate transistor, in which the gate electrode is on a side of the active layer that is farther from the base substrate.

Figure 9A:
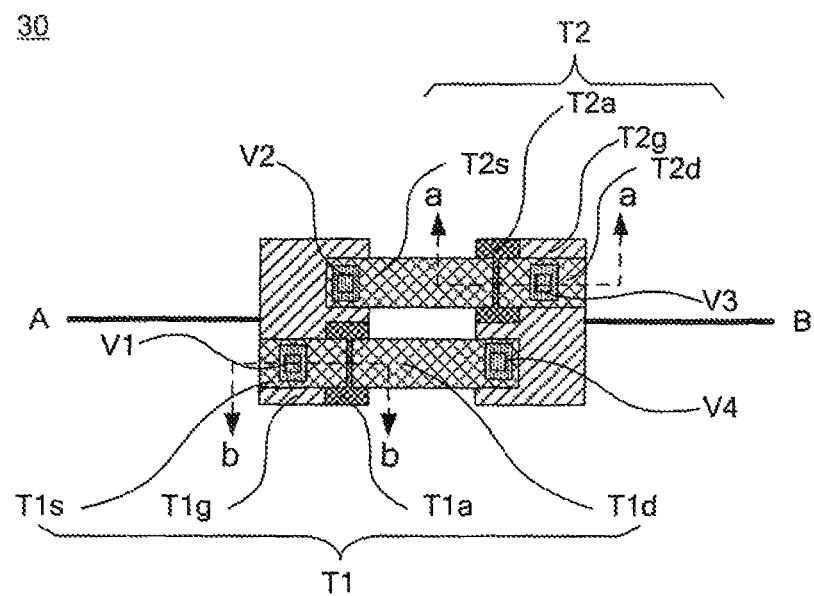
FIGS. 9A to 9D show schematic diagrams of a conductive link according to embodiments of the present disclosure.

In the embodiment illustrated in FIG. 9A, the trace A extends from the display substrate unit on one side of the gap into a first portion of the gap, and is electrically coupled to the first control electrode T1$g$. The trace B extends from the display substrate unit on the other side of the gap into a second portion of the gap, and is electrically coupled to the second control electrode T2g.

Figure 9B:
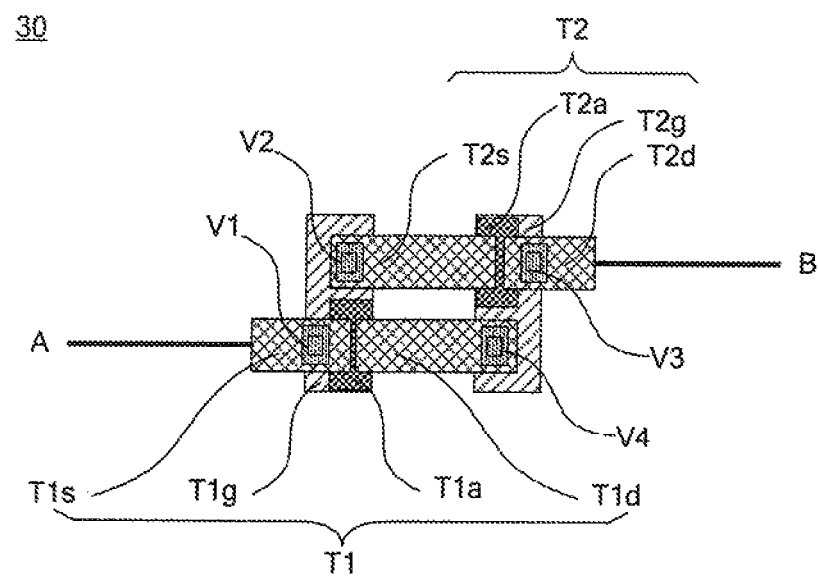

In the embodiment illustrated in FIG. 9B, the trace A extends from the display substrate unit on one side of the gap into a first portion of the gap, and is electrically coupled to the first sub-electrode T1s. The trace B extends from the display substrate unit on the other side of the gap into a second portion of the gap, and is electrically coupled to the fourth sub-electrode T2d.

Figure 9C:
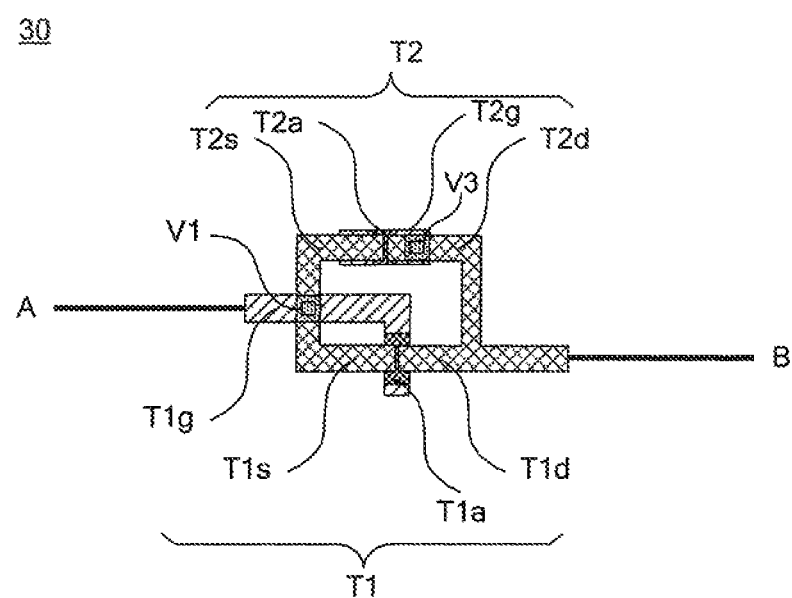

In the embodiment illustrated in FIG. 9C, the trace A extends from the display substrate unit on one side of the gap into a first portion of the gap, and is electrically coupled to the first control electrode T1g. The trace B extends from the display substrate unit on the other side of the gap into a second portion of the gap, and is electrically coupled to the fourth sub-electrode T2d.

Figure 9D:
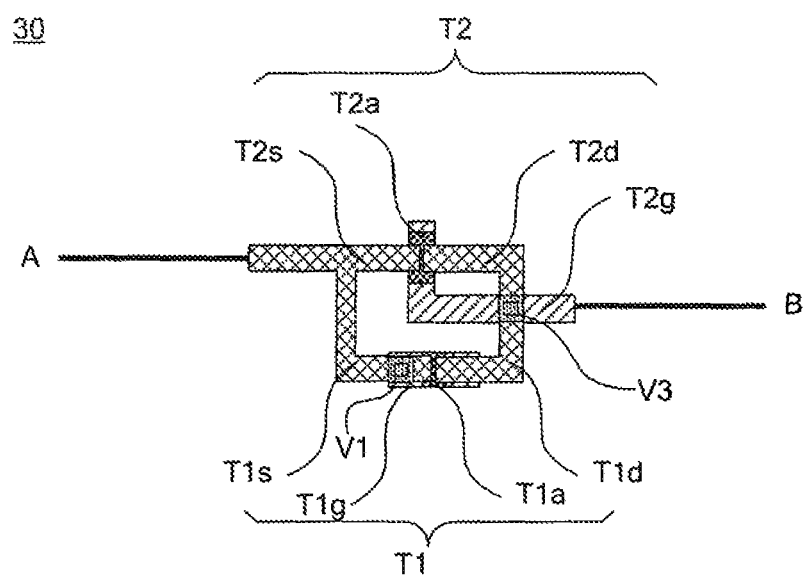

In the embodiment illustrated in FIG. 9D, the trace A extends from the display substrate unit on one side of the gap into a first portion of the gap, and is electrically coupled to the first sub-electrode T1s. The trace B extends from the display substrate unit on the other side of the gap into a second portion of the gap, and is electrically coupled to the second control electrode T2g.

In some embodiments, the corresponding components in the first transistor T1 and the second transistor T2 may be formed in the same patterning step, that is, using a single mask. As a result, the corresponding components in the first transistor T1 and the second transistor T2 may be provided in the same layer. For example, the first control electrode T1g and the second control electrode T2g are in the same layer, and formed in the same patterning step. The first active layer T1a and the second active layer T2a are in the same layer, and formed in the same patterning step. The first sub-electrode T1s, the second sub-electrode T1d, the third sub-electrode T2s, and the fourth sub-electrode T2d are in the same layer, and formed in the same patterning step.

To simplify construction, the traces and the corresponding components in the first and second transistors to which the traces are coupled may also be formed in the same layer, that is, in the same patterning step. For example, the traces may be formed as a unitary structure with their corresponding components in the first and second transistors.

In FIGS. 9A and 9B, the conductive link is an intra-layer conductive link, and is configured to couple traces that are in the same layer. In FIGS. 9C and 9D, the conductive link is an inter-layer conductive link, and is configured to couple traces that are in different layers.

Figure 10:
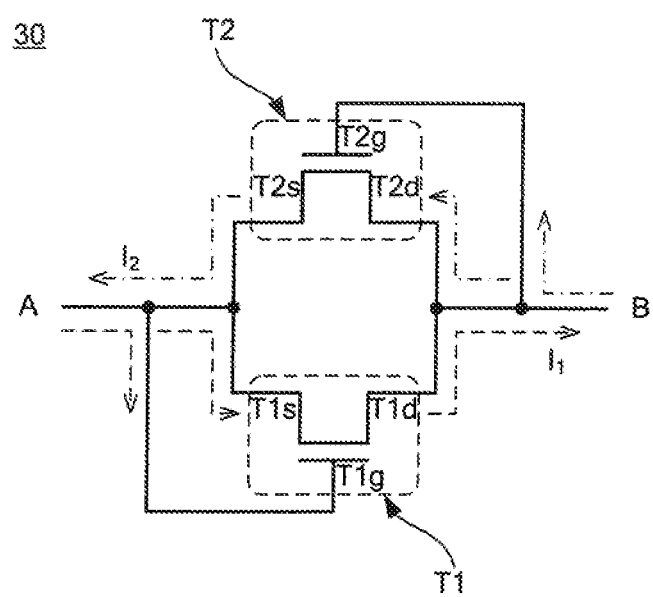
FIG. 10 shows a circuit diagram of a conductive link according to an embodiment of the present disclosure.

FIG. 10 shows a circuit diagram of a conductive link according to an embodiment of the present disclosure. The conductive link may be an intra-layer conductive link, or an inter-layer conductive link.

In the embodiment illustrated in FIG. 10, when static charge build-ups on the traces A, B produce a higher electric potential on trace A than on trace B, a large amount of static charge is accumulated at the first control electrode T1g of the first transistor T1. The amount of accumulated charge tends to be large, and produces an electric potential that far exceeds the threshold voltage of the first control electrode T1g. The electric potential created by the static charge build-up is sufficient to activate the first control electrode T1g, so as to transform the semiconducting first active layer into a conductor and form a channel in the first transistor T1.

The first control electrode T1g is electrically coupled to the first sub-electrode T1s, and the second sub-electrode T1d is electrically coupled to the second control electrode T2g and the fourth sub-electrode T2d of the second transistor T2.

As a result, the static charge build-up on the trace A can be quickly redistributes through the first transistor T1 and the second transistor T2 to trace B, which is electrically coupled to the second control electrode T2g and/or the fourth sub-electrode T2d. The conductive path is indicated by the dotted arrow $I_1$ in FIG. 10. The redistribution of the static charges makes it possible to quickly neutralize the charge imbalance between the traces A, B, thus preventing electrostatic discharge events or minimizing the risk of electrostatic discharges.

Referring still to the embodiment illustrated in FIG. 10, when static charge build-ups on the traces A, B produce a higher electric potential on trace B than on trace A, a large amount of static charge is accumulated at the second control electrode T2g of the second transistor T2. As described above, the first control electrode T1g is electrically coupled to the first sub-electrode T1s, and the second sub-electrode T1d is electrically coupled to the second control electrode T2g and the fourth sub-electrode T2d of the second transistor T2. As a result, the static charge build-up on the trace B can be quickly redistributed through the first transistor T1 and the second transistor T2 to trace A, which is electrically coupled to the first control electrode T1g and/or the first sub-electrode T1s. The conductive path is indicated by the dotted arrow $I_2$ in FIG. 10.

In other words, when the static charge build-ups on traces A, B creates a large electric potential difference between the traces A, B, the configurations of the first and second transistors T1, T2 makes it possible to redistribute the static charge build-ups from trace A to trace B, or vice versa. This redistribution effectively creates a substantially circular conductive path, that is, an electrostatically equilibrating conductive link. The conductive link allows any electric potential differences between the intra-layer or inter-layer traces in adjacent display substrate units to be quickly neutralized, and in so doing, turns the display motherboard into an electrostatically equilibrated conductor and reduces the risk of electrostatic discharges. In addition, it is understood that the present disclosure does not particularly limit the threshold potential difference for triggering the redistribution of charges. The conductive link may be configured, in any suitable manner known to a person of ordinary skill in the art, to operate according any threshold that is appropriate for the need and the specific implementations of the display device.

The first and second transistors T1, T2 become conductive only when the static charge build-ups on the traces coupled to the transistors are sufficiently large. As discussed above, the threshold may be set according to the need and specific implementations of the display device. The first and second transistors T1, T2 do not interfere with the signal voltages during array testing.

The conductive link according to the present disclosure is configured to accommodate and balance larger amounts of static charges than conventional techniques for preventing electrostatic discharges. As such, the conductive link according to the present disclosure can withstand a larger amount of static charges than the conventional techniques.

As described above, the first control electrode T1g and the second control electrode T2g are formed in the same layer. The first active layer T1a and the second active layer T2a are formed in the same layer. The first sub-electrode T1a, the second sub-electrode T1d, the third sub-electrode T2s, and the fourth sub-electrode T2d are formed in the same layer.

The first control electrode T1g and the second control electrode T2g may be formed with a first mask in a first patterning step. The first active layer T1a and the second active layer T2a may be formed with a second mask in a second patterning step. The first sub-electrode T1a, the second sub-electrode T1d, the third sub-electrode T2s, and the fourth sub-electrode T2d may be formed with a third mask in a third patterning step.

In some embodiments, the layers of the first and second transistors T1, T2 may be formed in the same patterning step as one or more layers of the thin film transistor in the display substrate unit, so as to further simplify and streamline the manufacturing of the display motherboard.

Figure 11:
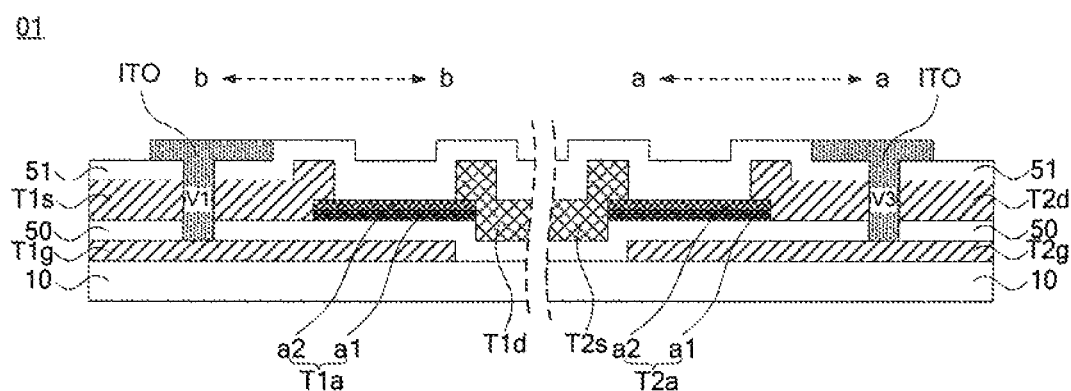
FIG. 11 shows a schematic diagram of a cross-section of the conductive link illustrated in FIG. 9A along the aa and bb lines.

FIG. 11 shows a schematic diagram of a cross-section of the conductive link illustrated in FIG. 9A along the a and bb lines.

As shown in FIG. 11, the display motherboard 01 may further include a first insulation layer 50 on a side of the first control electrode T1g and the second control electrode T2g opposite from the base substrate 10. The display motherboard 01 may further comprise a plurality of via holes V1, V2, V3, V4 that extend through the first insulation layer 50. The first active layer T1a, the first sub-electrode T1s, and the second sub-electrode T1d are on a side of the first insulation layer 50 opposite from the first control electrode T1g. The second active layer T2a, the third sub-electrode T2d, and the fourth sub-electrode T2d are on a side of the first insulation layer 50 opposite from the second control electrode T2g. In some embodiments, the plurality of via holes do not extend through the first control electrode T1g or the second control electrode T2g.

The first active layer T1a and the second active layer T2a each comprises an amorphous silicon (a-Si) layer a1 and an n-doped amorphous silicon (n+a-Si) layer a2 arranged in this order on the base substrate 10. The n-doped amorphous silicon (n+a-Si) layer a2 is composed of amorphous silicon doped with phosphorus (P), arsenic (As), and/or other Group 15 elements.

The first sub-electrode TIs and the second sub-electrode T1d abut and overlap with the n-doped amorphous silicon (n+a-Si) layer a2. The third sub-electrode T2s and the fourth sub-electrode T2d abut and overlap with the n-doped amorphous silicon (n+a-Si) layer a2. More particularly, the orthographic projection of each of the first sub-electrode TIs, the second sub-electrode T1d, the third sub-electrode T2s, and the fourth sub-electrode T2d on the base substrate 10 overlaps partially with the orthographic projection of the abutting n-doped amorphous silicon (n+a-Si) layer a2 on the base substrate 10, for example, as shown in FIG. 11. These configurations make it possible to improve the electrical contact between the first sub-electrode T1s, the second sub-electrode T1d, and the n-doped amorphous silicon (n+a-Si) layer a2, and likewise improve the electrical contact between the third sub-electrode T2s, the fourth sub-electrode T2d, and the n-doped amorphous silicon (n+a-Si) layer a2. Improving electrical contacts can in turn improve the electrical performances of the first transistor T1 and the second transistor T2.

In some embodiments, for example, as shown in FIG. 11, the display motherboard may further include a second insulation layer 51 that covers the first sub-electrode T1s, the second sub-electrode T1d, the third sub-electrode T2s, and the fourth sub-electrode T2d. In some embodiments, the orthographic projections of the first sub-electrode T1s, the second sub-electrode T1d, the third sub-electrode T2s, and the fourth sub-electrode T2d on the base substrate 10 are completely within the orthographic projection of the second insulation layer 51 on the base substrate 10. The second insulation layer 51 may be a passivation layer or a protective layer.

It is understood that even though the above description is of a cross-section of the conductive link illustrated in FIG. 9A along the aa and bb lines, the description may be extrapolated accordingly to the conductive link illustrated in each of FIGS. 9C to 9D.

The first control electrode T1g and the second control electrode T2g of the first transistor T1 and the second transistor T2, respectively, may be formed concurrently as the gate electrode of the thin film transistor in the display substrate unit. That is, the first control electrode T1g and the second control electrode T2g may be formed in a single patterning step using a single mask as the gate electrode of the thin film transistor.

The display substrate unit may also include a gate insulator that is configured to insulate the gate electrode and the active layer of the display substrate unit. The gate insulator may extend into the gap, and the first insulation layer 50 may be formed as a portion of the gate insulator that extends into the gap.

The above configurations of the first control electrode T1g, the second control electrode T2g, and the first insulation layer 50 may further simplify construction and streamline production.

The first control electrode T1g and the second control electrode T2g are provided in the same layer. The first active layer T1a and the second active layer T2a are provided in the same layer. The first sub-electrode T1s, the second sub-electrode T1d, the third sub-electrode T2s, and the fourth sub-electrode T2d are provided in the same layer. To facilitate explanation, FIG. 11 shows only the second transistor T2 and the arrangements of the various layers in the second transistor T2, but it is understood that FIG. 11 also applies to the first transistor T1.

The first control electrode T1g, the first sub-electrode T1s, and the third sub-electrode T2s are electrically coupled to each other. The second control electrode T2g, the second sub-electrode T1d, and the fourth sub-electrode T2d are electrically coupled to each other.

As shown in FIGS. 9A to 9D, the first sub-electrode TIs may be coupled to the first control electrode T1g through a first via hole V1 in the first insulation layer 50. The fourth sub-electrode T2d may be coupled to the second control electrode T2g through a third via hole V3 in the first insulation layer 50.

As shown in FIGS. 9A and 9B, the third sub-electrode T2s may be electrically coupled to the first control electrode T1g through a second via hole V2 in the first insulation layer 50.

In some embodiments, the third sub-electrode T2s and the first sub-electrode T1s may be formed as a unitary structure, for example, as shown in FIGS. 9C and 9D.

As shown in FIGS. 9A and 9B, the second sub-electrode 12d may be coupled to the second control electrode T2g via the fourth via hole V4 in the first insulation layer 50.

In some embodiments, the second sub-electrode T1d and the fourth sub-electrode T2d are formed as a unitary structure, for example, as shown in FIGS. 9C and 9D.

In some embodiments, for example, as shown in FIG. 11, the via holes V1, V2, V3, V4 may be filled with the indium tin oxide (ITO) materials for forming the pixel electrodes in the display substrate unit. Each of the via holes V1, V2, V3, V4 may be filled with the ITO materials at the time of forming the pixel electrodes in the display substrate unit. Put differently, the layers of ITO materials forming the pixel electrodes may overlap with the via holes V1, V2, V3, V4. In some embodiments, the first and second control electrode T1g, T2g may overlap the via holes V1, V3. For example, as shown in FIG. 11, when forming the first sub-electrode T1s, a portion of the first sub-electrode T1s is coupled to the underlying first control electrode T1g via the first via hole V, and when forming the fourth sub-electrode T2d, a portion of the forth sub-electrode T2d is coupled to the underlying second control electrode T2g via the third via hole V3.

The configurations of the via holes are not particularly limited, and the via holes may be configured in any appropriate manner known to a person of ordinary skill in the art depending on the need and/or specific implementations or manufacturing of the display motherboard.

The conductive link is provided in the gap between adjacent display subtract units, and electrically couples the gap portions of traces extending from those display substrate units, the traces being configured to transmit the same type of signals. More particularly, the conductive link is configured to electrically couple the display substrate units when a potential difference exists between the gap portions of the traces.

The descriptions below relate to connections between the conductive link and traces configured to transmit different types of signals.

Figure 12:
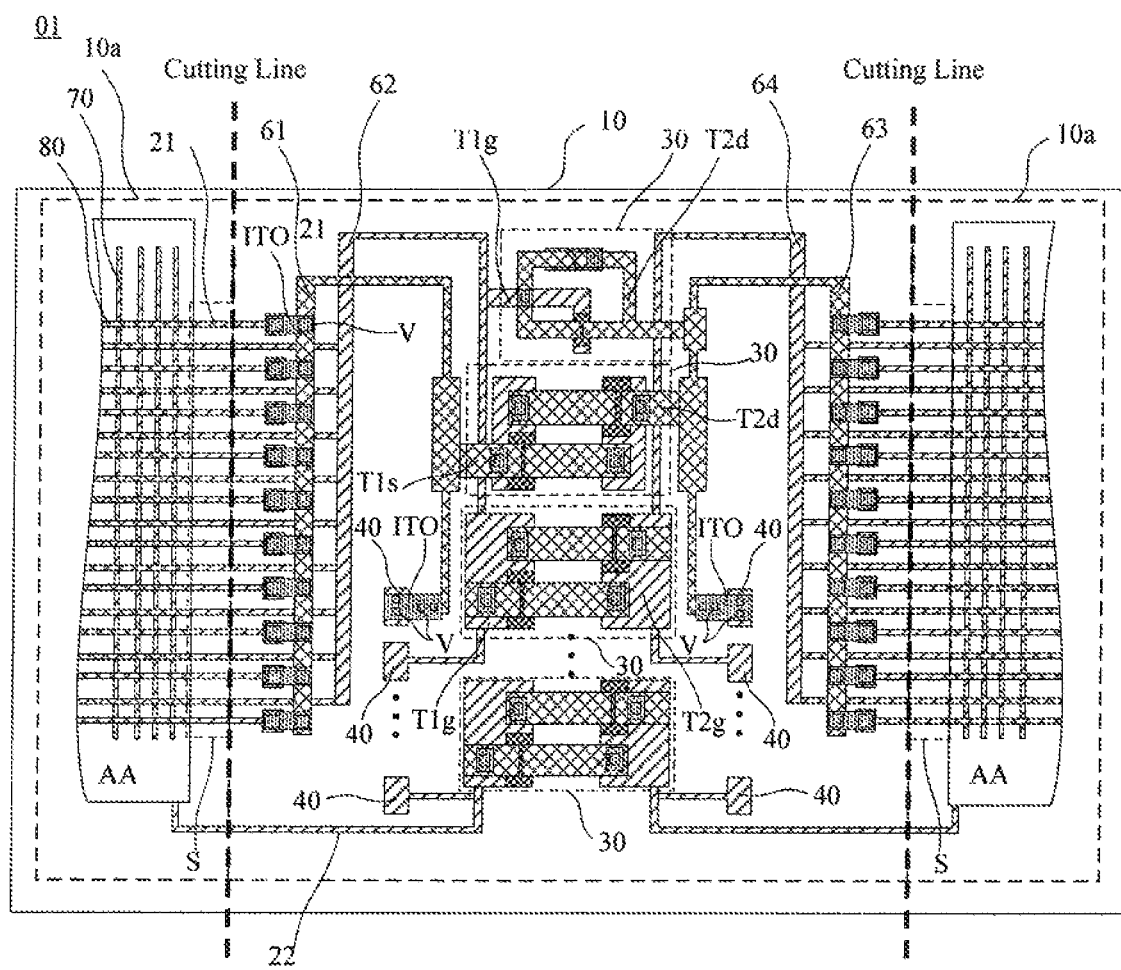
FIGS. 12 to 14 show schematic diagrams of top views of display motherboards according to embodiments of the present disclosure.

FIG. 12 shows a schematic diagram of the top view of a display motherboard according to an embodiment of the present disclosure.

The display motherboard may include a plurality of traces 20 that extend from the display substrate units 10a into the gaps 10b. The plurality of traces 20 may be configured to transmit the same or different signals. Further, for every type of signal, the signal may be transmitted via one or more of the plurality of traces 20.

In some embodiments, each of the plurality of traces 20 may be configured to transmit one type of signal. In some embodiments, each of the plurality of traces 20 may be configured to transmit a different type of signal from the other of the plurality of traces 20. In some embodiments, a first subset of the plurality of traces 20 may be configured to transmit a first type of signal (that is, the signal is loaded on each of the two or more of the plurality of traces 20), a second subset of the plurality of traces 20 a second type of signal, and so on, and the first and second types of signal are different.

As shown in FIG. 12, the plurality of traces 20 may include a plurality of leads 21 for data lines. The leads 21 extend in a direction parallel to the direction of an imaginary line extending from a first display substrate unit 10a, to a gap 10b on one side of the first display substrate unit, and to a second display substrate unit 10a on the other side of the gap 10b from the first display substrate unit 10a.

As shown in FIG. 12, the display motherboard may also include a first lead connector 61, a second lead connector 62, a third lead connector 63, and a fourth lead connector 64. The first, second, third, and fourth lead connectors 61, 62, 63, 64 are provided in the gap 10b.

The first lead connector 61 and the second lead connector 62 are configured to be coupled to the odd-numbered leads 21 and even-numbered leads 21, respectively, in the display substrate unit 10a on one side of the gap 10b. The fourth lead connector 63 and the fourth lead connector 64 are configured to be coupled to the odd-numbered leads 21 and even-numbered leads 21, respectively, in the display substrate unit 10a on the other side of the gap 10b.

The first, second, third, and fourth lead connectors 61, 62, 63, 64 as shown in FIG. 12 have a substantially L-shaped geometry. However, the configurations of the first, second, third, and fourth lead connectors 61, 62, 63, 64 are not particularly limited. The lead connectors 61, 62, 63, 64 may be configured in any appropriate manner known to a person of ordinary skill in the art depending on need and/or specific implementations of the display motherboard, as long as the lead connectors 61, 62, 63, 64 are capable of coupling the corresponding leads 21.

In some embodiments, the lead connectors 61, 62, 63, 64 may be directly coupled to the corresponding leads 21. In some embodiments, the lead connectors 61, 62, 63, 64 may be coupled to the corresponding leads 21 through the applicable via holes V, and may overlap with the ITO material filling the via holes V. For example, as shown in FIG. 12, the second lead connector 62 and the fourth lead connector 64 are directly coupled to the leads 21, but the first lead connector 61 and the third lead connector 63 are coupled to the leads 21 via via holes V.

In other words, the leads 21 for the data lines couple to the electrostatic equilibrator 30 via the lead connectors 61, 62, 63, 64.

As shown in FIG. 12, the first lead connector 61 and the third lead connectors 63 are provided in the same layer, and correspond to the same electrostatic equilibrator 30. For example, as shown in FIG. 9B, the electrostatic equilibrator 30 includes a first transistor T1 and a second transistor T2. The first lead connector 61 (designated "A" in FIG. 9B) and the first sub-electrode T1s of the electrostatic equilibrator 30 are provided in the same layer, and are coupled to each other. The third lead connector 63 (designated "B" in FIG. 9B) and the fourth sub-electrode T2d of the electrostatic equilibrator 30 are provided in the same layer, and are coupled to each other.

In other words, the first lead connector 61 and the third lead connector 63 are electrically coupled to the electrostatic equilibrator 30 to form an intra-layer conductive link.

The second lead connector 62 and the fourth lead connector 64 are provided in the same layer, and correspond to the same electrostatic equilibrator 30. For example, as shown in FIG. 9A, the electrostatic equilibrator 30 includes the first transistor T1 and the second transistor T2. The second lead connector 62 (designated "A" in FIG. 9A) and the first control electrode T1g of the electrostatic equilibrator 30 are provided in the same layer, and are coupled to each other. The fourth lead connector 64 (designated "B" in FIG. 9A) and the second control electrode T2g of the electrostatic equilibrator 30 are provided in the same layer, and are coupled to each other.

In other words, the second lead connector 62 and the fourth lead connector 64 are electrically coupled to the electrostatic equilibrator 30 to form an intra-layer conductive link.

The second lead connector 62 and the third lead connector 63 are provided in different layers, and correspond to the same electrostatic equilibrator 30. For example, as shown in FIG. 9C, the electrostatic equilibrator 30 includes the first transistor T1 and the second transistor T2. The second lead connector 62 (designated "A" in FIG. 9C) and the first control electrode T1g of the electrostatic equilibrator 30 are provided in the same layer, and are coupled to each other. The third lead connector 63 (designated "B" in FIG. 9C) and the fourth sub-electrode T2d are provided in the same layer, and are coupled to each other. As shown in FIG. 9C, the fourth sub-electrode T2d and the second sub-electrode T1d form a unitary structure.

In other words, the second lead connector 62 and the third lead connector 63 are electrically coupled to the electrostatic equilibrator 30 to form an inter-layer conductive link.

The first lead connector 61 and the fourth lead connector 64 are provided in different layers, and correspond to the same electrostatic equilibrator 30. For example, as shown in FIG. 9D, the electrostatic equilibrator 30 includes the first transistor T1 and the second transistor T2. The first lead connector 61 (designated "A" in FIG. 9D) and the first sub-electrode T1s of the electrostatic equilibrator 30 are provided in the same layer, and are coupled to each other. As shown in FIG. 9D, the first sub-electrode T1s and the third sub-electrode T2s form a unitary structure. The fourth lead connector 64 (designated "B" in FIG. 9D) and the second control electrode T2g of the electrostatic equilibrator 30 are provided in the same layer, and are coupled to each other.

In other words, the first lead connector 61 and the fourth lead connector 64 are electrically coupled to the electrostatic equilibrator 30 to form an inter-layer conductive link.

The electrostatic equilibrator 30 coupled to the first lead connector 61 and the fourth lead connector 64 in different layers is symmetrical with respect to the electrostatic equilibrator 30 electrically coupled to the second lead connector 62 and the third lead connector 63 in different layers, for example, as shown in FIG. 9D. The configuration in which the first lead connector 61 and the fourth lead connector 64 are electrically coupled to their corresponding electrostatic equilibrator 30 is the same as the configuration in which the second lead connector 62 and the third lead connector 63 are electrically coupled to their corresponding electrostatic equilibrator 30.

As shown in FIG. 12, the display substrate unit 10a may further include an active area AA corresponding to the display area of the final display substrate product, and a circuit area S. The circuit area S is between the active area AA and the gap 10b. The leads 21 for the data lines extend through the circuit area S and into the gap 10b.

In some embodiments, the display motherboard 01 may further include a plurality of gate lines 70, and a plurality of data lines 80.

Each of the plurality of leads 21 corresponds to one of the plurality of data lines 80, and each of the plurality of leads 21 is electrically coupled to the corresponding one of the plurality of data lines 80.

In some embodiments, the leads 21, gate lines 70, the second lead connector 62, and the fourth lead connector 64 are provided in the same layer. The data lines 80, the first lead connector 61, and the third lead connector 63 are provided in the same layer.

However, it is understood that the above-described arrangement and distribution of the different components in different layers are only exemplary, and the different components may be arranged and distributed among the layers of the display motherboard in any appropriate manner known to a person of ordinary skill in the art depending on the specific implementations of the display motherboard.

In some embodiments, the leads 21 and the data lines 80 may be provided in different layers, and may be coupled to each other via the via holes. The leads 21 and the data lines 80 may be coupled to each other by any appropriate means known to a person of ordinary skill in the art.

The leads 21, the gate lines 70, the second lead connector 62, and the fourth lead connector 64 may be formed of the same material (for example, the material for forming the gate metal layer). Further, the leads 21, the gate lines 70, the second lead connector 62, and the fourth lead connector 64 may be formed in a single patterning step using a single mask, so as to simplify construction and fabrication.

The data lines 80, the first lead connector 61, and the third lead connector 63 may be formed of the same material (for example, the material for forming the source/drain metal layer). Further, the data lines 80, the first lead connector 61, and the third lead connector 63 may be formed in a single patterning step using a single mask, so as to further simplify construction and fabrication.

Relative to the base substrate 10, the source/drain metal layer is on the gate metal layer. An insulation layer (for example, a gate insulator) may be provided between the layer comprising the leads 21, the gate lines 70, the second lead connector 62, and the fourth lead connector 64, and the layer comprising the signal lines 80, the first lead connector 61, and the third lead connector 63. The insulation layer is commonly composed of a transparent material, or a material having a high transmissivity.

As shown in FIG. 12, the plurality of traces 21 may further include a plurality of display drive signal lines 22. The plurality of display drive signal lines 22 may be configured to transmit different types of signals. For example, as shown in FIG. 9A, the electrostatic equilibrator 30 includes the first transistor T1 and the second transistor T2. The display drive signal lines 22, the first control electrode T1g, and the second control electrode T2g are provided in the same layer. The display drive signal lines 22 extending from the adjacent display substrate units 10a into the gap 10b, and configured to transmit the same type of signals, are coupled to the first control electrode T1g and the second control electrode T2g of the electrostatic equilibrator 30.

FIG. 12 shows the STV (Start Vertical) lines of the display drive signal lines 22 and the corresponding electrostatic equilibrator 30. In addition to the STV lines for transmitting gate start signals, the plurality of display drive signal lines 22 may also include clock lines for transmitting clock signals; ADD lines for transmitting ADD signals (i.e., auxiliary data signals); VDD lines for transmitting VDD signals (i.e., digital power signals); VSS lines for transmitting VSS signals (i.e., digital ground signals). It is understood that the display drive signal lines 22 configured to transmit the above signals may be coupled to a corresponding electrostatic equilibrator 30 by any appropriate means in any appropriate manner known to a person of ordinary skill in the art.

As shown in FIG. 12, the display motherboard 01 according to the present disclosure may further include at least one test electrode 40 in the gap 10b. The at least one test electrode 40 is configured to supply test signals to the traces 20.

In some embodiments, each of the at least one test electrode 40 may be coupled to a gap portion of the corresponding trace 20. In some embodiments, each of the at least one test electrode 40 may be coupled to the corresponding trace 20 via the portion of the electrode of the electrostatic equilibrator 30 coupled to and provided in the same layer as the trace 20. The present disclosure does not particularly limit the manner in which the at least one test electrode 40 is coupled to the trace 20, so long as the test electrode 40 is capable of supplying test signals to the trace 20.

In some embodiments, the electrostatic equilibrator 30 is a conductor block. The conductor block is configured to be electrically coupled to the gap portions of the traces from adjacent display substrate units. When a potential difference exists between the gap portions, the conductor block is able to quickly neutralize the static charge build-ups in the respective display substrate units.

In some embodiments, the conductor block may be directly coupled to the gap portions of the traces. In some embodiments, the conductor block may be coupled to the traces via via holes.

To increase production efficiency, the conductor block may be formed concurrently as other components (for example, the pixel electrodes) in the display substrate units. That is, the conductor block and those other components may be formed in a single patterning step using a single mask. This makes it possible to manufacture the conductor block using known technologies, and to maintain production reliability.

The conductor block is configured to electrically couple the gap portions of traces extending from adjacent display substrate units. More particularly, when a potential difference exists between gap portions of traces that extend from adjacent display substrate units and that transmit the same type of signals, the conductor block is configured to electrically couple the gap portions of those traces.

To prevent the conductor block from interfering with the array test, the conductor block may be severed prior to the array test. The conductor block has effectively converted the entire display motherboard 01 into an electrostatically equilibrated conductor, and as such, severing the conductor block before performing the array test may also reduce the risk of an electrostatic discharge event during testing.

Figure 13:
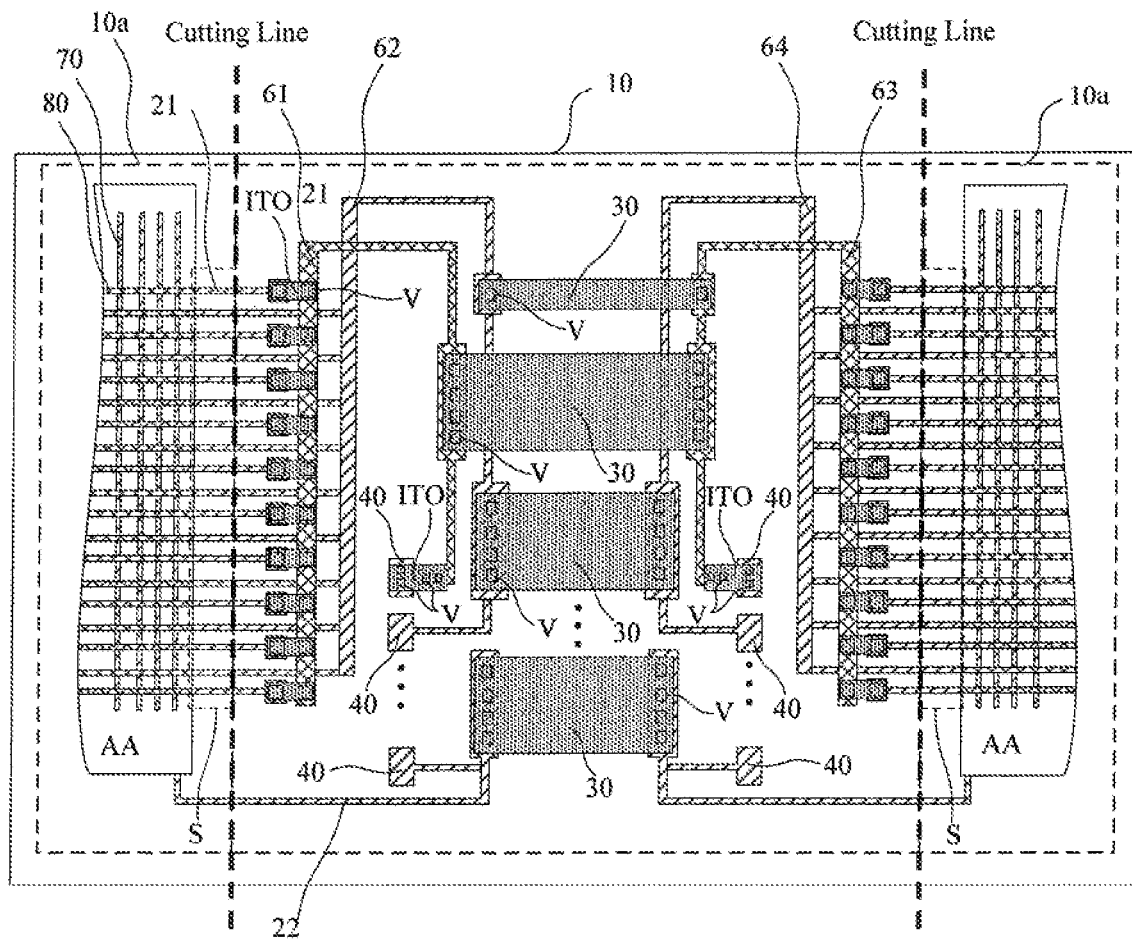

FIG. 13 shows a schematic diagram of the top view of a display motherboard according to an embodiment of the present disclosure.

As shown in FIG. 13, the plurality of traces include the plurality of leads 21 for data lines. The plurality of leads 21 are spaced apart from each other, and arranged on the display motherboard at regular intervals. The leads 21 extend in a direction parallel to the direction of an imaginary line extending from a first display substrate unit 10*a*, to a gap 10*b* on one side of the first display substrate unit, and to a second display substrate unit 10*a* on the other side of the gap 10*b* from the first display substrate unit 10*a*. The leads 21 are arranged to be parallel to each other.

The display motherboard may further include the first lead connector 61, the second lead connector 62, the third lead connector 63, and the fourth lead connector 64. The first, second, third, and fourth lead connectors 61, 62, 63, 64 are provided in the gap 10*b* between adjacent display substrate units 10*a*.

The first lead connector 61 and the second lead connector 62 are configured to be coupled to the odd-numbered leads 21 and even-numbered leads 21, respectively, in the display substrate unit 10*a* on one side of the gap 10*b*. The fourth lead connector 63 and the fourth lead connector 64 are configured to be coupled to the odd-numbered leads 21 and even-numbered leads 21, respectively, in the display substrate unit 10*a* on the other side of the gap 10*b*.

The first, second, third, and fourth lead connectors 61, 62, 63, 64 as shown in FIG. 13 have a substantially L-shaped geometry. However, the configurations of the first, second, third, and fourth lead connectors 61, 62, 63, 64 are not particularly limited. The lead connectors 61, 62, 63, 64 may be configured in any appropriate manner known to a person of ordinary skill in the art depending on need and/or specific implementations of the display motherboard, as long as the lead connectors 61, 62, 63, 64 are capable of coupling the corresponding leads 21.

In some embodiments, the lead connectors 61, 62, 63, 64 may be directly coupled to the corresponding leads 21. In some embodiments, the lead connectors 61, 62, 63, 64 may be coupled to the corresponding leads 21 through the applicable via holes V, and may overlap with the ITO material filling the via holes V. For example, as shown in FIG. 13, the second lead connector 62 and the fourth lead connector 64 are directly coupled to the leads 21, but the first lead connector 61 and the third lead connector 63 are coupled to the leads 21 via via holes V.

In other words, the leads 21 for the data lines couple to the electrostatic equilibrator 30 via the lead connectors 61, 62, 63, 64.

As shown in FIG. 13, the first lead connector 61 and the third lead connectors 63 are provided in the same layer, and correspond to the same electrostatic equilibrator 30. The electrostatic equilibrator 30 is configured as a conductor block. In other words, the electrostatic equilibrator 30 that is electrically coupled to the first and third lead connectors 61, 63 forms an intra-layer conductor block with respect to those lead connectors.

The second lead connector 62 and the fourth lead connector 64 are provided in the same layer, and correspond to the same electrostatic equilibrator 30. The electrostatic equilibrator 30 is configured as a conductor block. In other words, the electrostatic equilibrator 30 that is electrically coupled to the second and fourth lead connectors 62, 64 also forms an intra-layer conductor block with respect to those lead connectors.

The second lead connector 62 and the third lead connector 63 are provided in different layers, and correspond to the same electrostatic equilibrator 30. The electrostatic equilibrator 30 is configured as a conductor block. In other words, the electrostatic equilibrator 30 that is electrically coupled to the second and third lead connectors 62, 63 forms an inter-layer conductor block with respect to those lead connectors.

The first lead connector 61 and the fourth lead connector 64 are provided in different layers, and correspond to the same electrostatic equilibrator 30. The electrostatic equilibrator 30 is configured as a conductor block. In other words, the electrostatic equilibrator 30 that is electrically coupled to the first and fourth lead connectors 61, 64 forms an inter-layer conductor block with respect to those lead connectors.

The electrostatic equilibrator 30 electrically coupled to the first lead connector 61 and the fourth lead connector 64 in different layers is symmetrically arranged with the electrostatic equilibrator 30 electrically coupled to the second lead connector 62 and the third lead connector 63 in different layers.

The conductor block may be formed concurrently as other components (for example, the pixel electrodes) in the display substrate units. That is, the conductor block and those other components may be formed in a single patterning step using a single mask. In some embodiments, the conductor block is formed in the same patterning step as the pixel electrodes in the display substrate unit using a single mask, and may be composed of the same material (for example, indium tin oxide) as the pixel electrode.

Figure 14:
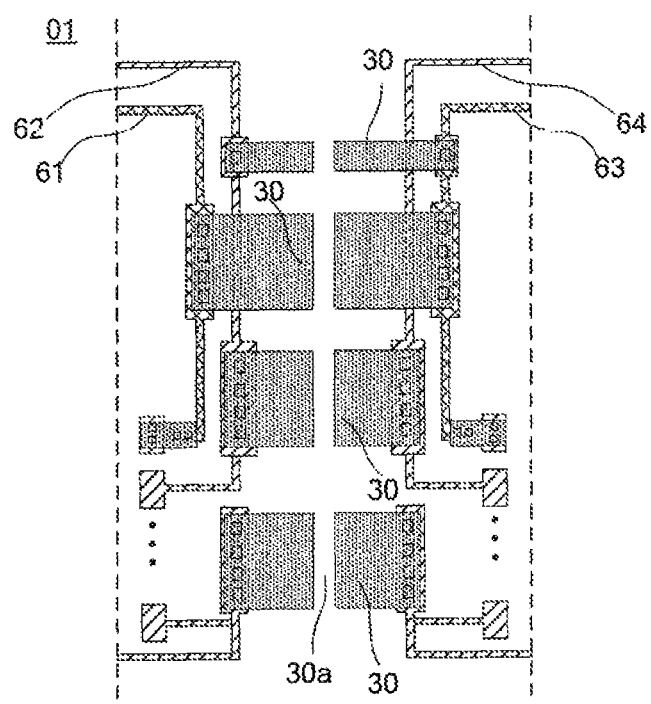

In some embodiments, to prevent the conductor block from interfering with the subsequent array tests, the conductor block may be severed as shown in FIG. 14. More particularly, when forming the common electrodes in the display substrate unites, the wet etching process used to form the common electrodes may also be used to sever the conductor block. A channel 30*a* is formed between the severed portions of the conductor block, for example, as shown in FIG. 14.

In some embodiments, the conductor block is coupled to the corresponding lead connector through a via hole in the portion of the passivation layer that extends into the gap between the adjacent display substrate units.

As shown in FIG. 13, the display substrate unit 10*a* may further include an active area AA corresponding to the display area of the final display substrate product, and a circuit area S. The circuit area S is between the active area AA and the gap 10*b*. The leads 21 for the data lines extend through the circuit area S and into the gap 10*b*.

In some embodiments, the display motherboard 01 may further include a plurality of gate lines 70, and a plurality of data lines 80 in the active area AA of the display substrate unit 10*a*.

Each of the plurality of leads 21 corresponds to one of the plurality of data lines 80, and each of the plurality of leads 21 is electrically coupled to the corresponding one of the plurality of data lines 80.

In some embodiments, the leads 21, gate lines 70, the second lead connector 62, and the fourth lead connector 64 are provided in the same layer. The data lines 80, the first lead connector 61, and the third lead connector 63 are provided in the same layer.

However, it is understood that the above-described arrangement and distribution of the different components in different layers are only exemplary, and the different components may be arranged and distributed among the layers of the display motherboard in any appropriate manner known to a person of ordinary skill in the art depending on the specific implementations of the display motherboard.

As shown in FIG. 13, the plurality of traces 21 may further include a plurality of display drive signal lines 22. The plurality of display drive signal lines 22 may be configured to transmit different types of signals. The display drive signal lines 22 that extend from adjacent display substrate unites 10*a* into the gap 10*b*, and that are configured to transmit the same type of signals, correspond to the same electrostatic equilibrator 30.

The display motherboard 01 according to the present disclosure may further include at least one test electrode 40 in the gap 10*b*. The at least one test electrode 40 is configured to supply test signals to the traces 20.

The traces, lead connectors, and test electrode may be configured as described above, for example, for the embodiment illustrated in FIG. 12.

The present disclosure also provides a method of fabricating a display motherboard.

The method of fabricating the display motherboard may include the following steps:

Step S1 includes forming the display substrate units and the traces that extend into the gaps between adjacent display substrate units.

Step S2 includes forming at least one electrostatic equilibrator in each gap between adjacent display substrate units.

When a potential difference exists between two display substrate units due to static charge build-ups on their respective traces, the electrostatic equilibrator is configured to electrically couple the portions of the traces that extend into the gap between the adjacent display substrate units.

The electrostatic equilibrator may be formed in any appropriate manner by any appropriate means known to a person of ordinary skill in the art. For example, the electrostatic equilibrator may be formed in part, or in whole, in the same patterning step, using a single mask, as components in the display substrate unit that are provided in the same layer as the electrostatic equilibrator. This makes it possible to manufacture the electrostatic equilibrator using existing technologies, and to maintain production reliability.

The advantages that are possible with the display motherboard according to the present disclosure may also be obtained by fabricating the display motherboard in the manner described in the present disclosure.

In embodiments where the electrostatic equilibrator is a conductor block, step S2 may further include the following steps:

Step S21 includes performing a single patterning step, using a single mask, to form at least one pixel electrode in the display substrate unit and the conductor block in the gap.

Step S22 includes cutting the conductor block, so as to break the traces that extend into the gap between the adjacent display substrate units. Cutting the conductor block may prevent the conductor block from interfering with the subsequent array tests.

In some embodiments, the method of fabricating a display motherboard may further include a step S3 of forming at least one second pixel electrode in the display substrate unit. The at least one second pixel electrode is arranged to be opposite from the at least one first pixel electrode.

The present disclosure does not particularly limit the design, configuration, or construction of the first and second pixel electrodes. The first and second pixel electrodes may be configured in any appropriate manner known to a person of ordinary skill in the art, and may be formed by any appropriate means known to that person, so long as the first and second pixel electrodes are capable of functioning as pixel electrode and common electrode, respectively.

If the conductor block and the pixel electrode in the display substrate unit are formed in the same patterning step, the conductor block may be subsequently cut in the same patterning step as the forming of the common electrode. Conversely, if the conductor block and the common electrode in the display substrate unit are formed in the same patterning step may be subsequently cut in the same patterning step as the forming of the pixel electrode.

The present disclosure also provides a display substrate.

Figure 15:
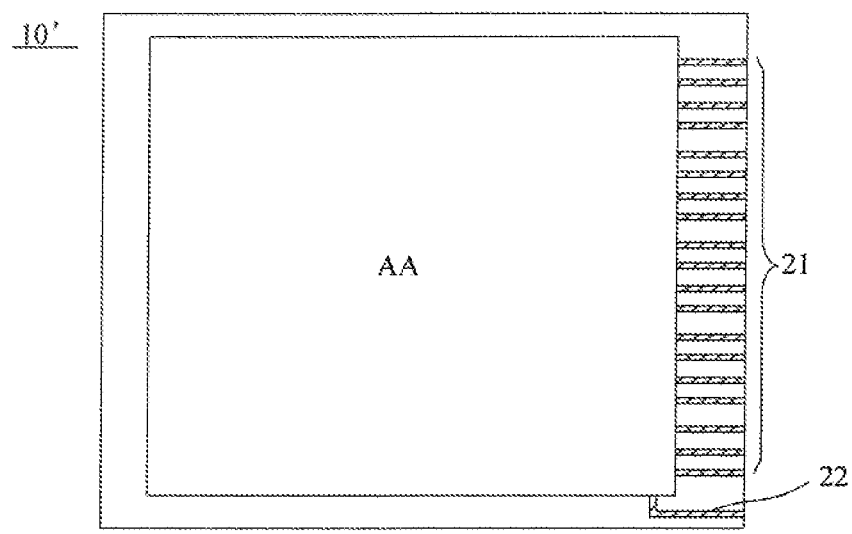
FIG. 15 shows a schematic diagram of a top view of a display substrate according to an embodiment of the present disclosure.

FIG. 15 shows a schematic diagram of a top view of a display substrate according to an embodiment of the present disclosure.

As shown in FIG. 15, the display substrate 10' is formed by cutting the display motherboard described above along the cutting lines to separate and obtain the individual display substrate units 10*a*. As shown in FIGS. 7, 8, 12, and 13, the cutting lines are between each display substrate unit 10*a* and the adjacent gap 10*b*.

Cutting the display motherboard severs the leads 21 for data lines, the display drive signal lines 22, and other traces that extend into the gap 10*b*, and produces individual display substrates 10' that are independent from each other. The display substrate 10' according to the present disclosure may be an array substrate, and may include at least one thin film transistor (TFT), at least one scan line, at least one signal line, at least one pixel electrode, and any other appropriate components and accessories known to a person of ordinary skill in the art.

The present disclosure also provides a display device.

Figure 16:
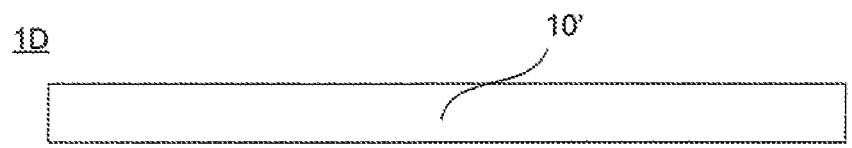
FIG. 16 shows a schematic diagram of a cross-section of a display device according to an embodiment of the present disclosure.

FIG. 16 shows a schematic diagram of a cross-section of a display device according to an embodiment of the present disclosure. As shown in FIG. 16, the display device 1D includes a display substrate 10' described above.

In some embodiments, the display substrate 10' is an array substrate, and is assembled with a color filter substrate to form the display device. In some embodiments, the display substrate 10' is a color filter on array substrate, and color filters are formed on the army substrate. In such embodiments, the display substrate 10' may be assembled with a cover glass to form the display device.

In some embodiments, the display device 1D may include a backlight, a drive circuit, and any other appropriate components and accessories known to a person of ordinary skill in the art. A display device according to the present disclosure may be integrated into any device configured to provide a display function, including, but not limited to, a liquid crystal display (LCD) device, an organic light emitting diode (OLED) display device, a portal android device (PAD), an MP4 (MPEG-4 Part 14) device, a mobile phone, a tablet, a television, a computer, a display, a notebook computer, a digital photo frame, a navigation system, and any other products or components that provide a display function.

References in the present disclosure made to the term "some embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples. In addition, for a person of ordinary skill in the art, the disclosure relates to the scope of the present disclosure, and the technical scheme is not limited to the specific combination of the technical features, and also should cover other technical schemes which are formed by combining the technical features or the equivalent features of the technical features without departing from the inventive concept. Unless otherwise defined, all the technical and scientific terms used herein have the same meanings as commonly understood by one of ordinary skill in the art to which the present invention belongs. Terms such as "first," "second," and so on, are not intended to indicate any sequence, amount or importance, but distinguish various components. Terms such as "comprises," "comprising," "includes," "including." and so on, are intended to specify that the elements or the objects stated before these terms encompass the elements or the objects and equivalents thereof listed after these terms, but do not preclude the other elements or objects. Phrases such as "connect", "connected", and the like, are not intended to define a physical connection or mechanical connection, but may include an electrical connection, directly or indirectly. Terms such as "on," "under," "right," "left" and the like are only used to indicate relative position relationship, and when the position of the object which is described is changed, the relative position relationship may be changed accordingly.

The principle and the embodiment of the present disclosures are set forth in the specification. The description of the embodiments of the present disclosure is only used to help understand the embodiments of the present disclosure and the core idea thereof. Meanwhile, for a person of ordinary skill in the art, the disclosure relates to the scope of the disclosure, and the technical scheme is not limited to the specific combination of the technical features, and also should covered other technical schemes which are formed by combining the technical features or the equivalent features of the technical features without departing from the inventive concept. For example, technical scheme may be obtained by replacing the features described above as disclosed in this disclosure (but not limited to) with similar features.

What is claimed is:

1. A display motherboard, comprising:
 a plurality of display substrate units on a base substrate,
 a gap between adjacent display substrate units, and
 at least one electrostatic equilibrator in the gap,
 wherein each display substrate unit comprises at least one trace comprising a display portion that extends into the display substrate unit and a gap portion that extends into a respective gap adjacent to the display substrate unit;
 each electrostatic equilibrator is configured to electrically couple gap portions of traces of the adjacent display substrate units, so as to form a conductive path between the gap portions;
 the electrostatic equilibrator is a conductive link comprising a first transistor coupled to a second transistor;
 the first transistor comprises a first control electrode on the base substrate, a first active layer on the first control electrode, a first sub-electrode on the base substrate and overlapping with a first end portion of the first active layer, and a second sub-electrode on the base substrate and overlapping with a second end portion of the first active layer opposite from the first end portion;
 the second transistor comprises a second control electrode on the base substrate and positioned to be directly opposite from the first control electrode, a second active layer on the second control electrode, a third sub-electrode on the base substrate and overlapping with a first end portion of the second active layer, and a fourth sub-electrode on the base substrate and overlapping with a second end portion of the second active layer opposite from the first end portion of the second active layer;
 a gap portion of a first trace of a first display substrate unit on one side of the gap is coupled to the first control electrode or the first sub-electrode;
 a gap portion of a second trace of a second display substrate unit on an opposite side of the gap from the first display substrate unit is coupled to the second control electrode or the fourth sub-electrode;
 the first trace and the second trace are configured to transmit a same type of signal;
 the conductive link is an inter-layer conductive link;
 when the gap portion of the first trace is electrically coupled to the first control electrode, the gap portion of the second trace is electrically coupled to the fourth sub-electrode, and
 when the gap portion of the first trace is electrically coupled to the first sub-electrode, the gap portion of the second trace is electrically coupled to the second control electrode.

2. The display motherboard according to claim 1, wherein:
 the first control electrode, the first sub-electrode, and the third sub-electrode are electrically coupled to each other, and
 the second control electrode, the second sub-electrode, and the fourth sub-electrode are electrically coupled to each other.

3. The display motherboard according to claim 1, wherein:
 the first control electrode and the second control electrode are formed in a first layer on the base substrate,
 the first active layer and the second active layer are formed in a second layer on the base substrate, and
 the first sub-electrode, the second sub-electrode, the third sub-electrode, and the fourth sub-electrode are formed in a third layer on the base substrate.

4. The display motherboard according to claim 1, wherein:

the display motherboard further comprises a first insulation layer on a side of the first control electrode and the second control electrode opposite from the base substrate, and a plurality of via holes that extend through the first insulation layer.

5. The display motherboard according to claim 4, wherein:
   the first control electrode is coupled to the first sub-electrode and the third sub-electrode through a first set of via holes, and
   the second control electrode is coupled to the second sub-electrode and the fourth sub-electrode through a second set of via holes.

6. The display motherboard according to claim 4, wherein at least a portion of the plurality of via holes are filled with a conductive material.

7. The display motherboard according to claim 4, wherein:
   the first sub-electrode, the first active layer, the second sub-electrode, the third sub-electrode, the second active layer, and the fourth sub-electrode are on a side of the first insulation layer opposite from the first control electrode and the second control electrode.

8. The display motherboard according to claim 4, wherein the plurality of via holes do not extend through the first control electrode or the second control electrode.

9. A method of fabricating the display motherboard according to claim 1, the method comprising:
   forming the plurality of display substrate units, and
   forming the at least one trace and the at least one electrostatic equilibrator to which the at least one trace is coupled in a same patterning step using a single mask.

10. A method of fabricating a display substrate, the method comprising:
    forming a display motherboard according to the method of claim 9, and cutting the display motherboard to separate the plurality of display substrate units from each other.

11. A method of fabricating the display motherboard according to claim 1, the method comprising:
    forming the plurality of display substrate units, and at least one trace, and
    forming the conductive link,
    wherein the forming of the conductive link comprises:
    performing a first patterning step using a single first mask to form the first control electrode and the second control electrode on the base substrate,
    performing a second patterning step using a single second mask to form the first active layer and the second active layer on the base substrate, and
    performing a third patterning step using a single third mask to form the first sub-electrode, the second sub-electrode, the third sub-electrode, and the fourth sub-electrode on the base substrate.

12. A display motherboard, comprising:
    a plurality of display substrate units on a base substrate,
    a gap between adjacent display substrate units, and
    at least one electrostatic equilibrator in the gap,
    wherein each display substrate unit comprises at least one trace comprising a display portion that extends into the display substrate unit and a gap portion that extends into a gap adjacent to the display substrate unit;
    each electrostatic equilibrator is configured to electrically couple gap portions of traces of the adjacent display substrate units, so as to form a conductive path between the gap portions;
    the electrostatic equilibrator is a conductive link comprising a first transistor coupled to a second transistor;
    the first transistor comprises a first control electrode on the base substrate, a first active layer on the first control electrode, a first sub-electrode on the base substrate and overlapping with a first end portion of the first active layer, and a second sub-electrode on the base substrate and overlapping with a second end portion of the first active layer opposite from the first end portion;
    the second transistor comprises a second control electrode on the base substrate and positioned to be directly opposite from the first control electrode, a second active layer on the second control electrode, a third sub-electrode on the base substrate and overlapping with a first end portion of the second active layer, and a fourth sub-electrode on the base substrate and overlapping with a second end portion of the second active layer opposite from the first end portion of the second active layer;
    the first active layer and the second active layer each comprises an amorphous silicon layer on the base substrate and an n-doped amorphous silicon layer on the amorphous silicon layer; and
    orthographic projection of each of the first sub-electrode, the second sub-electrode, the third sub-electrode, and the fourth sub-electrode on the base substrate overlaps partially with orthographic projection of the n-doped amorphous silicon layer of each of the first active layer and the second active layer on the base substrate.

* * * * *